United States Patent
Patel et al.

(10) Patent No.: US 9,650,837 B2
(45) Date of Patent: May 16, 2017

(54) MULTI-CHAMFER CUTTING ELEMENTS HAVING A SHAPED CUTTING FACE AND EARTH-BORING TOOLS INCLUDING SUCH CUTTING ELEMENTS

(71) Applicant: Baker Hughes Incorporated, Houston, TX (US)

(72) Inventors: Suresh G. Patel, The Woodlands, TX (US); David A. Stockey, The Woodlands, TX (US); Alejandro Flores, Spring, TX (US); Anthony A. DiGiovanni, Houston, TX (US); Danny E. Scott, Montgomery, TX (US); Leroy W. Ledgerwood, III, Cypress, TX (US)

(73) Assignee: BAKER HUGHES INCORPORATED, Houston, TX (US)

( * ) Notice: Subject to any disclaimer, the term of this patent is extended or adjusted under 35 U.S.C. 154(b) by 251 days.

(21) Appl. No.: 14/480,293

(22) Filed: Sep. 8, 2014

(65) Prior Publication Data

US 2016/0069140 A1 Mar. 10, 2016

(51) Int. Cl.
*E21B 10/46* (2006.01)
*E21B 10/54* (2006.01)
(Continued)

(52) U.S. Cl.
CPC .......... *E21B 10/5673* (2013.01); *B24D 18/00* (2013.01); *B24D 99/005* (2013.01);
(Continued)

(58) Field of Classification Search
CPC ...... E21B 10/5673; E21B 10/43; E21B 10/55; E21B 10/46; E21B 10/54;
(Continued)

(56) References Cited

U.S. PATENT DOCUMENTS 4,224,380 A 9/1980 Bovenkerk et al.
4,538,690 A 9/1985 Short
(Continued)

FOREIGN PATENT DOCUMENTS

CN 2278759 Y 4/1998
CN 2579580 Y 10/2003
(Continued)

OTHER PUBLICATIONS

Chinese Office Action for Chinese Application No. 201180026366.0 dated Apr. 29, 2014.
(Continued)

*Primary Examiner* — Cathleen Hutchins
(74) *Attorney, Agent, or Firm* — TraskBritt

(57) ABSTRACT

A cutting element for an earth-boring tool includes a substrate and volume of superabrasive material positioned on the substrate. The volume of superabrasive material includes a cutting face having at least one recess extending into the volume of superabrasive material and/or at least one protrusion extending outward from the volume of superabrasive material. The volume of superabrasive material includes a first chamfer surface having a peripheral edge and a radially innermost edge. The peripheral edge of the first chamfer surface is located proximate a cutting edge of the volume of superabrasive material. A radial width of the first chamfer surface is between about 0.002 inch and about 0.045 inch. The volume of superabrasive material also includes a second chamfer surface having a peripheral edge and a radially innermost edge. The peripheral edge of the second chamfer surface is located adjacent the radially innermost edge of the first chamfer surface.

15 Claims, 11 Drawing Sheets

(51) Int. Cl.
  *E21B 10/56* (2006.01)
  *E21B 10/567* (2006.01)
  *E21B 10/55* (2006.01)
  *B24D 99/00* (2010.01)
  *E21B 10/43* (2006.01)
  *B24D 18/00* (2006.01)
  *C23C 16/27* (2006.01)

(52) U.S. Cl.
  CPC ............. *E21B 10/43* (2013.01); *E21B 10/55* (2013.01); *C23C 16/27* (2013.01)

(58) Field of Classification Search
  CPC ......... E21B 2010/545; E21B 2010/561; E21B 10/56; E21B 2010/562
  See application file for complete search history.

(56) References Cited

U.S. PATENT DOCUMENTS

| | | | |
|---|---|---|---|
| 4,539,018 A | 9/1985 | Whanger | |
| 4,558,753 A | 12/1985 | Barr | |
| 4,593,777 A | 6/1986 | Barr | |
| 4,629,373 A | 12/1986 | Hall | |
| 4,858,707 A | 8/1989 | Jones et al. | |
| 4,872,520 A | 10/1989 | Nelson | |
| 4,984,642 A | 1/1991 | Renard et al. | |
| 4,997,049 A | 3/1991 | Tank et al. | |
| 5,007,207 A | 4/1991 | Phaal et al. | |
| 5,027,912 A | 7/1991 | Juergens | |
| 5,054,246 A | 10/1991 | Phaal et al. | |
| 5,078,219 A | 1/1992 | Morrell et al. | |
| 5,127,923 A | 7/1992 | Bunting et al. | |
| 5,172,778 A | 12/1992 | Tibbitts | |
| 5,333,699 A | 8/1994 | Thigpen | |
| 5,351,772 A | 10/1994 | Smith | |
| 5,355,969 A | 10/1994 | Hardy et al. | |
| 5,377,773 A | 1/1995 | Tibbitts | |
| 5,437,343 A | 8/1995 | Cooley et al. | |
| 5,447,208 A | 9/1995 | Lund et al. | |
| 5,449,048 A | 9/1995 | Thigpen et al. | |
| 5,533,582 A | 7/1996 | Tibbitts | |
| 5,549,171 A | 8/1996 | Mensa et al. | |
| 5,569,000 A | 10/1996 | Llittecke et al. | |
| 5,607,024 A | 3/1997 | Keith | |
| 5,653,300 A | 8/1997 | Lund et al. | |
| 5,881,830 A | 3/1999 | Cooley | |
| 5,890,552 A | 4/1999 | Scott et al. | |
| 5,944,129 A | 8/1999 | Jensen | |
| 5,967,250 A | 10/1999 | Lund et al. | |
| 5,984,005 A | 11/1999 | Hart et al. | |
| 6,006,846 A | 12/1999 | Tibbitts et al. | |
| 6,045,440 A | 4/2000 | Johnson et al. | |
| 6,050,354 A * | 4/2000 | Pessier | E21B 10/16 175/425 |
| 6,059,054 A | 5/2000 | Portwood et al. | |
| 6,065,554 A | 5/2000 | Taylor et al. | |
| 6,068,071 A | 5/2000 | Jurewicz et al. | |
| 6,145,608 A | 11/2000 | Lund et al. | |
| 6,164,394 A | 12/2000 | Mensa-Wilmot et al. | |
| 6,187,068 B1 | 2/2001 | Frushour et al. | |
| 6,196,340 B1 | 3/2001 | Jensen et al. | |
| 6,196,910 B1 | 3/2001 | Johnson et al. | |
| 6,202,770 B1 | 3/2001 | Jurewicz et al. | |
| 6,202,771 B1 | 3/2001 | Scott et al. | |
| 6,220,376 B1 | 4/2001 | Lundell | |
| 6,328,117 B1 | 12/2001 | Berzas et al. | |
| 6,450,271 B1 | 9/2002 | Tibbitts et al. | |
| 6,524,363 B2 | 2/2003 | Gates, Jr. et al. | |
| 6,527,065 B1 | 3/2003 | Tibbitts et al. | |
| 6,550,556 B2 | 4/2003 | Middlemiss et al. | |
| 6,935,444 B2 | 8/2005 | Lund et al. | |
| 6,962,218 B2 | 11/2005 | Eyre | |
| 7,000,715 B2 | 2/2006 | Sinor et al. | |
| 7,188,692 B2 | 3/2007 | Lund et al. | |
| 7,363,992 B2 | 4/2008 | Stowe et al. | |
| 7,373,998 B2 | 5/2008 | Cariveau et al. | |
| 7,533,740 B2 | 5/2009 | Zhang et al. | |
| 7,740,090 B2 | 6/2010 | Shen et al. | |
| 7,814,998 B2 | 10/2010 | Patel et al. | |
| 7,861,808 B2 | 1/2011 | Zhang et al. | |
| 8,016,054 B2 | 9/2011 | Lancaster et al. | |
| 8,061,456 B2 | 11/2011 | Patel et al. | |
| 8,191,656 B2 | 6/2012 | Dourfaye et al. | |
| 8,210,288 B2 | 7/2012 | Chen et al. | |
| 8,684,112 B2 | 4/2014 | DiGiovanni et al. | |
| 8,739,904 B2 | 6/2014 | Patel | |
| D712,941 S | 9/2014 | Mo | |
| 8,833,492 B2 | 9/2014 | Durairajan et al. | |
| 2002/0071729 A1 | 6/2002 | Middlemiss et al. | |
| 2004/0009376 A1 | 1/2004 | Wan et al. | |
| 2005/0247492 A1 | 11/2005 | Shen et al. | |
| 2005/0269139 A1 | 12/2005 | Shen et al. | |
| 2006/0201712 A1 | 9/2006 | Zhang et al. | |
| 2007/0235230 A1 | 10/2007 | Cuillier et al. | |
| 2008/0006448 A1 | 1/2008 | Zhang et al. | |
| 2008/0035380 A1 | 2/2008 | Hall et al. | |
| 2008/0164071 A1 | 7/2008 | Patel et al. | |
| 2008/0264696 A1 | 10/2008 | Dourfaye et al. | |
| 2008/0308321 A1 | 12/2008 | Aliko et al. | |
| 2009/0008155 A1 | 1/2009 | Sherwood, Jr. | |
| 2009/0057031 A1 | 3/2009 | Patel et al. | |
| 2009/0114628 A1 | 5/2009 | DiGiovanni | |
| 2009/0260877 A1 | 10/2009 | Wirth | |
| 2009/0321146 A1 | 12/2009 | Dick et al. | |
| 2010/0084198 A1 | 4/2010 | Durairajan et al. | |
| 2010/0104874 A1 | 4/2010 | Yong et al. | |
| 2010/0276200 A1 | 11/2010 | Schwefe et al. | |
| 2010/0288564 A1 | 11/2010 | Dovalina, Jr. et al. | |
| 2010/0307829 A1 | 12/2010 | Patel | |
| 2010/0326741 A1 | 12/2010 | Patel | |
| 2010/0326742 A1 | 12/2010 | Vempati et al. | |
| 2011/0000714 A1 | 1/2011 | Durairajan et al. | |
| 2011/0031030 A1 | 2/2011 | Shen et al. | |
| 2011/0031031 A1 | 2/2011 | Vempati et al. | |
| 2011/0031036 A1 | 2/2011 | Patel | |
| 2011/0088950 A1 | 4/2011 | Scott et al. | |
| 2011/0171414 A1 | 7/2011 | Sreshta et al. | |
| 2011/0259642 A1 | 10/2011 | DiGiovanni et al. | |
| 2011/0303466 A1 | 12/2011 | DiGiovanni | |
| 2012/0037431 A1 | 2/2012 | DiGiovanni et al. | |
| 2012/0205162 A1 | 8/2012 | Patel et al. | |
| 2013/0068534 A1* | 3/2013 | DiGiovanni | E21B 10/5673 175/428 |
| 2013/0068537 A1 | 3/2013 | DiGiovanni | |
| 2013/0068538 A1 | 3/2013 | DiGiovanni et al. | |
| 2013/0292188 A1 | 11/2013 | Bilen et al. | |
| 2014/0238753 A1 | 8/2014 | Nelms et al. | |
| 2014/0246253 A1* | 9/2014 | Patel | E21B 10/5673 175/430 |

FOREIGN PATENT DOCUMENTS

| | | |
|---|---|---|
| CN | 1714224 A | 12/2005 |
| CN | 201024900 Y | 2/2008 |
| CN | 201202408 Y | 3/2009 |
| EP | 546725 A1 | 9/1996 |
| EP | 835981 A2 | 4/1998 |
| EP | 656458 B1 | 2/1999 |
| EP | 979699 A1 | 2/2000 |
| WO | 9415058 A1 | 7/1994 |
| WO | 9427769 A1 | 12/1994 |
| WO | 0048789 A1 | 8/2000 |
| WO | 0160554 A1 | 8/2001 |
| WO | 2008006010 A3 | 5/2008 |

OTHER PUBLICATIONS

Russian Office Action for Russian Application No. 2012 149 79 dated Feb. 13, 2015.

Chinese Office Action and Search Report for Chinese Application No. 201280051840 dated May 27, 2015, 15 pages.

(56) References Cited

OTHER PUBLICATIONS

Guilin Color Engineered Diamond Technology (EDT) Co. Ltd., Brochure, Offshore Technology Conference Apr. 30-May 3, 2012.
Guilin Star Diamond Superhard Material Co. Ltd., Brochure, Offshore Technology Conference Apr. 30-May 3, 2012.
Pilkey in Peterson's Stress Concentration Factors (2d ed., Wiley Interscience 1997), in Section 2.6.6, on p. 71 (1997).
Patel et al., U.S. Appl. No. 14/480,293 entitled, Multi-Chamfer Cutting Elements Having a Shaped Cutting Face, Earth-Boring Tools Including Such Cutting Elements, and Related Methods, filed Sep. 8, 2014.
International Search Report for International Application No. PCT/US2015/048840 dated Nov. 30, 2015, 3 pages.
International Written Opinion for International Application No. PCT/US2015/048840 dated Nov. 30, 2015, 9 pages.

\* cited by examiner

MULTI-CHAMFER CUTTING ELEMENTS HAVING A SHAPED CUTTING FACE AND EARTH-BORING TOOLS INCLUDING SUCH CUTTING ELEMENTS

CROSS-REFERENCE TO RELATED APPLICATIONS

The subject matter of this patent application is related to the subject matter of U.S. patent application Ser. No. 13/092, 396, filed Apr. 22, 2011, now U.S. Pat. No. 8,684,112, issued on Apr. 1, 2014, to DiGiovanni et al.; and to the subject matter of U.S. patent application Ser. No. 13/472,377, filed as May 15, 2012, now U.S. Pat. No. 9,482,057, issued on Nov. 1, 2016, to DiGiovanni et al.; and to the subject matter of U.S. patent application Ser. No. 13/477,905, filed May 22, 2012, now U.S. Pat. No. 9,243,452, issued on Jan 26, 2016, to DiGiovanni et al.; and to the subject matter of U.S. patent application Ser. No. 13/840,195, filed Mar. 15, 2013, now U.S. Pat. No. 9,428,966, issued on Aug. 30, 2016, to Patel et al.; and to the subject matter of U.S. patent application Ser. No. 13/609,575, filed Sep. 11, 2012, now U.S. Pat. No. 9,103,174, issued on Aug. 11, 2015, to DiGiovanni; and to the subject matter of U.S. patent application Ser. No. 13/461, 388, filed May 1, 2012, now U.S. Pat. No. 8,991,525, issued on Mar. 31, 2015, to Bilen et al.; and to the subject matter of U.S. Pat. No. 6,935,444, issued on Aug. 30, 2005, to Lund et al.; and to the subject matter of U.S. Pat. No. 6,145,608, issued on Nov. 14, 2000, to Lund et al.; and to the subject matter of U.S. Pat. No. 5,437,343, issued on Aug. 1, 1995, to Cooley et al., the entire disclosure of each of which is incorporated herein by this reference.

TECHNICAL FIELD

Embodiments of the present disclosure relate to earth-boring tools, cutting elements for such earth-boring tools, and related methods.

BACKGROUND

Wellbores are formed in subterranean formations for various purposes including, for example, extraction of oil and gas from the subterranean formation and extraction of geothermal heat from the subterranean formation. Wellbores may be formed in a subterranean formation using a drill bit such as, for example, an earth-boring rotary drill bit. Different types of earth-boring rotary drill bits are known in the art including, for example, fixed-cutter bits (which are often referred to in the art as "drag" bits), rolling-cutter bits (which are often referred to in the art as "rock" bits), diamond-impregnated bits, and hybrid bits (which may include, for example, both fixed cutters and rolling cutters). The drill bit is rotated and advanced into the subterranean formation. As the drill bit rotates, the cutters or abrasive structures thereof cut, crush, shear, and/or abrade away the formation material to form the wellbore. A diameter of the wellbore drilled by the drill bit may be defined by the cutting structures disposed at the largest outer diameter of the drill bit.

The drill bit is coupled, either directly or indirectly, to an end of what is referred to in the art as a "drill string," which comprises a series of elongated tubular segments connected end-to-end that extends into the wellbore from the surface of the formation. Often various tools and components, including the drill bit, may be coupled together at the distal end of the drill string at the bottom of the wellbore being drilled. This assembly of tools and components is referred to in the art as a "bottom-hole assembly" (BHA).

The drill bit may be rotated within the wellbore by rotating the drill string from the surface of the formation, or the drill bit may be rotated by coupling the drill bit to a downhole motor, which is also coupled to the drill string and disposed proximate the bottom of the wellbore. The downhole motor may comprise, for example, a hydraulic Moineau-type motor having a shaft, to which the drill bit is mounted, that may be caused to rotate by pumping fluid (e.g., drilling mud or fluid) from the surface of the formation down through the center of the drill string, through the hydraulic motor, out from nozzles in the drill bit, and back up to the surface of the formation through the annular space between the outer surface of the drill string and the exposed surface of the formation within the wellbore.

BRIEF SUMMARY

This summary does not identify key features or essential features of the claimed subject matter, nor does it limit the scope of the claimed subject matter in any way.

In some embodiments, the present disclosure includes a cutting element for an earth-boring tool including a substrate and a volume of superabrasive material positioned on the substrate. The volume of superabrasive material includes a cutting face having one or more of at least one recess extending into the volume of superabrasive material and at least one protrusion extending outward from the volume of superabrasive material. The volume of superabrasive material includes a first chamfer surface having a peripheral edge and a radially innermost edge. The peripheral edge of the first chamfer surface is located proximate a cutting edge of the volume of superabrasive material. A radial width of the first chamfer surface, measured between the peripheral edge and the radially innermost edge of the first chamfer surface in a plane transverse to a longitudinal axis of the cutting element, is between about 0.002 inch and about 0.045 inch. The volume of superabrasive material also includes a second chamfer surface having a peripheral edge and a radially innermost edge. The peripheral edge of the second chamfer surface is located adjacent the radially innermost edge of the first chamfer surface.

In other embodiments, the present disclosure includes an earth-boring tool having at least one cutting element affixed to a tool body of the earth-boring tool. The at least one cutting element includes a volume of superabrasive material positioned on a substrate. The volume of superabrasive material includes a cutting face having one or more of at least one recess extending into the volume of superabrasive material and at least one protrusion extending outward from the volume of superabrasive material. The volume of superabrasive material includes a first chamfer surface having a peripheral edge and a radially innermost edge. The peripheral edge of the first chamfer surface is located proximate a cutting edge of the volume of superabrasive material. A radial width of the first chamfer surface, measured between the peripheral edge and the radially innermost edge of the first chamfer surface in a plane transverse to a longitudinal axis of the cutting element, is between about 0.002 inch and about 0.045 inch. The volume of superabrasive material also includes a second chamfer surface having a peripheral edge and a radially innermost edge. The peripheral edge of the second chamfer surface is located adjacent the radially innermost edge of the first chamfer surface.

BRIEF DESCRIPTION OF THE DRAWINGS

While the specification concludes with claims particularly pointing out and distinctly claiming what are regarded as embodiments of the present disclosure, various features and advantages of this disclosure may be more readily ascertained from the following description of example embodiments of the disclosure provided with reference to the accompanying drawings.

DETAILED DESCRIPTION

The illustrations presented herein are not actual views of any particular earth-boring tool, drill bit, cutting element, or component of such a tool or bit, but are merely idealized representations which are employed to describe embodiments of the present disclosure.

As used herein, the term "earth-boring tool" means and includes any tool used to remove formation material and form a bore (e.g., a wellbore) through the formation by way of removing the formation material. Earth-boring tools include, for example, rotary drill bits (e.g., fixed-cutter or "drag" bits and roller cone or "rock" bits), hybrid bits including both fixed cutters and roller elements, coring bits, percussion bits, bi-center bits, reamers (including expandable reamers and fixed-wing reamers), and other so-called "hole-opening" tools, etc.

As used herein, the term "cutting element" means and includes any element of an earth-boring tool that is used to cut or otherwise disintegrate formation material when the earth-boring tool is used to form or enlarge a bore in the formation.

As used herein, the term "polish," and any derivative thereof, when used to describe a condition of a surface of a volume of superabrasive material or a substrate of a cutting element, means and includes any of the methods and/or processes disclosed herein to provide a surface having a surface finish roughness less than about 10 μin. (about 0.254 μm) root mean square (RMS) (all surface finishes referenced herein being RMS).

Figure 1:
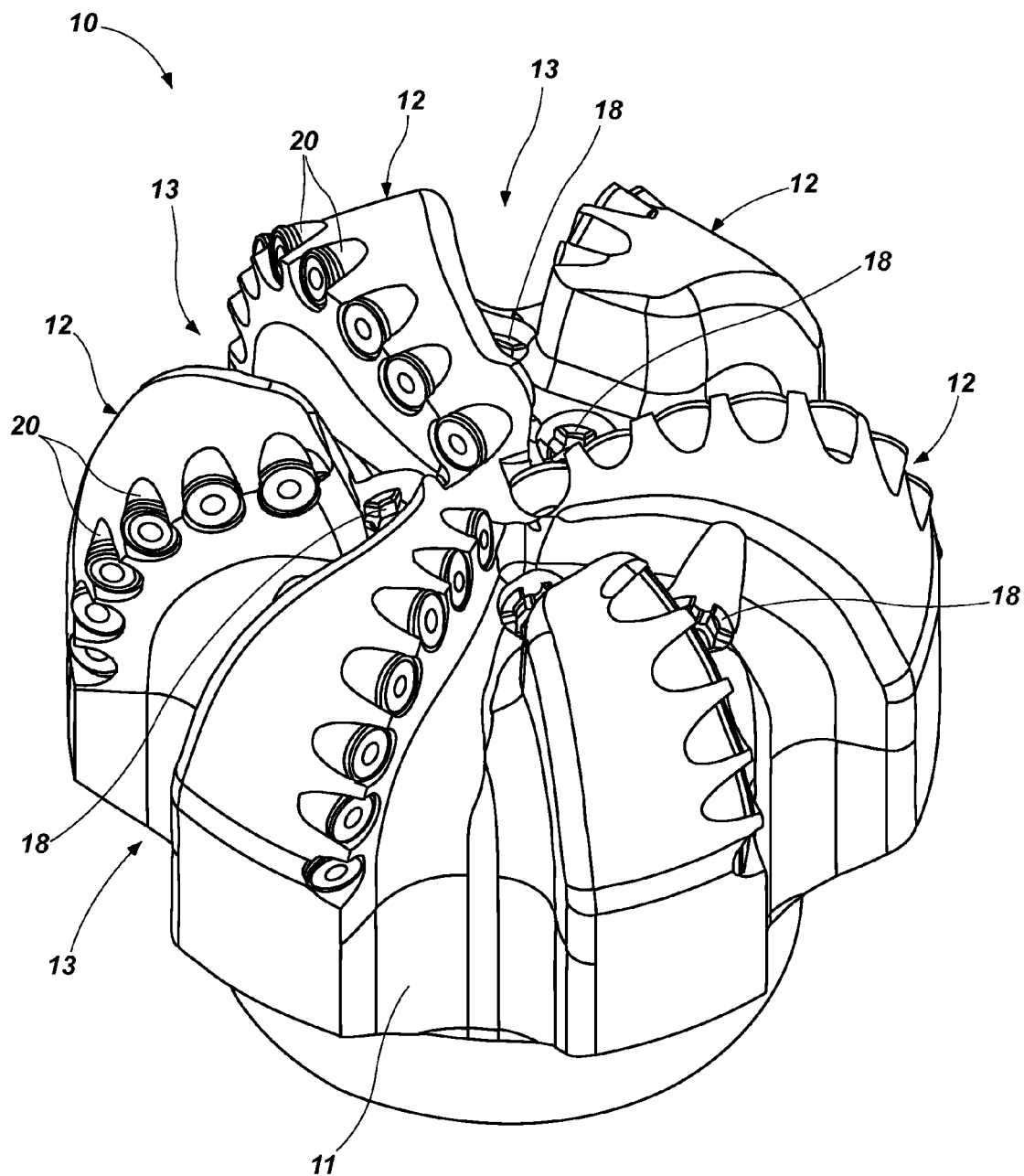
FIG. 1 illustrates a perspective view of an earth-boring drill bit with blades carrying cutting elements, according to an embodiment of the present disclosure.

FIG. 1 illustrates an embodiment of an earth-boring tool of the present disclosure. The earth-boring tool of FIG. 1 is a fixed-cutter rotary drill bit 10 having a bit body 11 that includes a plurality of blades 12 that project outwardly from the bit body 11 and are separated from one another by fluid courses 13. The portions of the fluid courses 13 that extend along the radial sides (the "gage" areas of the drill bit 10) are often referred to in the art as "junk slots." The bit body 11 further includes a generally cylindrical internal fluid plenum, and fluid passageways (not visible) that extend through the bit body 11 to an exterior surface of the bit body 11. Nozzles 18 may be secured within the fluid passageways proximate the exterior surface of the bit body 11 for controlling the hydraulics of the drill bit 10 during drilling. A plurality of cutting elements 20 is mounted to each of the blades 12.

During a drilling operation, the drill bit 10 may be coupled to a drill string (not shown). As the drill bit 10 is rotated within the wellbore, drilling fluid may be pumped down the drill string, through the internal fluid plenum and fluid passageways within the bit body 11 of the drill bit 10, and out from the drill bit 10 through the nozzles 18. Formation cuttings generated by the cutting elements 20 of the drill bit 10 may be carried with the drilling fluid through the fluid courses 13, around the drill bit 10, and back up the wellbore through the annular space within the wellbore outside the drill string.

Figure 2:
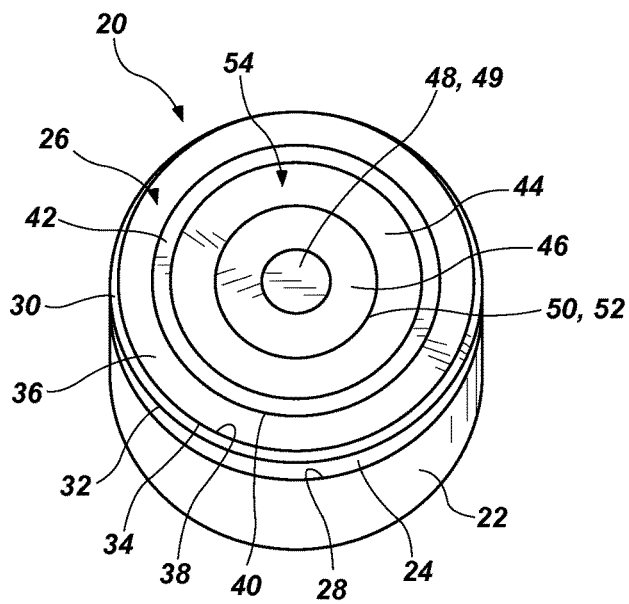
FIG. 2 illustrates a perspective view of a multi-chamfer cutting element having a cutting face with a recess therein, according to an embodiment of the present disclosure.

FIG. 2 is a perspective view of a cutting element 20 of the drill bit 10 of FIG. 1. The cutting element 20 includes a cutting element substrate 22 having a volume of superabrasive material, such as a diamond table 24, disposed thereon. The diamond table 24 may comprise a polycrystalline diamond (PCD) material, having a cutting face 26 defined thereon. Superabrasive materials may also be characterized as "superhard" materials and include natural and synthetic diamond, cubic boron nitride and diamond-like carbon materials. Additionally, an interface 28 may be defined between the cutting element substrate 22 and diamond table 24.

The diamond table 24 may be formed on the cutting element substrate 22, or the diamond table 24 and the cutting element substrate 22 may be separately fonded and subsequently attached together. The cutting element substrate 22 may be formed from a material that is relatively hard and resistant to wear. For example, the cutting element substrate 22 may be formed from and include a ceramic-metal composite material (which is often referred to as a "cermet" material). The cutting element substrate 22 may include a cemented carbide material, such as a cemented tungsten carbide material, in which tungsten carbide particles are cemented together in a metallic binder material. The metallic binder material may include, for example, cobalt, nickel, iron, or alloys and mixtures thereof. In some instances, the cutting element substrate 22 may comprise two or more pieces, one piece directly supporting the diamond table 24, and one or more additional pieces bonded thereto. In any case, the cutting elements 20 may be secured in pockets on blades 12 as depicted in FIG. 1, such as by brazing.

While the diamond table 24 and the substrate 22 may each be generally cylindrical in shape, as shown in FIG. 2, it is to be appreciated that the substrate 22 and the diamond table 24 may each have other shapes. By way of non-limiting example, the substrate 22 and the diamond table 24 may have an elliptical shape, a triangular shape, or a non-symmetrical shape when viewed in a plane transverse to a longitudinal axis L of the cutting element 20, as more fully described in the aforementioned U.S. Pat. No. 9,243,452, issued on Jan. 26, 2016, to DiGiovanni et al.

Referring to FIG. 2, the diamond table 24 may have a multi-chamfered edge. For example, the diamond table 24 may have a first chamfer surface 30 at a radial periphery of the diamond table 24. A peripheral edge 32 of the first chamfer surface 30 may define a primary cutting edge of the diamond table 24. The first chamfer surface 30 may extend radially inward from the peripheral edge 32 of the first chamfer surface 30 to a radially innermost edge 34 of the first chamfer surface 30. A second chamfer surface 36 of the diamond table 24 may extend radially inward from a peripheral edge 38 of the second chamfer surface 36 (coincident with the radially innermost edge 34 of the first chamfer surface 30) to a radially innermost edge 40 of the second chamfer surface 36. In other embodiments (not shown), one or more additional chamfer surfaces may optionally be located between the peripheral edge 32 and the radially innermost edge 40. It is to be appreciated that, while the first and second chamfer surfaces 30, 36 are depicted as being generally straight when viewed in a longitudinal cross-sectional plane, in other embodiments (not shown), all or portions of the first and second chamfer surfaces 30, 36 may be curved, convex, concave, or irregularly shaped when viewed in a longitudinal cross-sectional plane. Cutting elements with multiple chamfer surfaces are more fully described in the aforementioned U.S. Pat. No. 6,935,444, issued on Aug. 30, 2005, to Lund et al.; U.S. Pat. No. 6,145,608, issued on Nov. 14, 2000, to Lund et al., and U.S. Pat. No. 5,437,343, issued on Aug. 1, 1995, to Cooley et al.

A planar, flat surface 42 of the diamond table 24 may be located radially inward of the second chamfer surface 36. The flat surface 42 may extend annularly over the cutting face 26 about the longitudinal axis L of the cutting element 20. The flat surface 42 may extend radially inward from the radially innermost edge 40 of the second chamfer surface 36 and may be substantially transverse (i.e., perpendicular) to the longitudinal axis L of the cutting element 20. Alternatively, the flat surface 42 may be positioned at a non-perpendicular angle with respect to the longitudinal axis L of the cutting element 20.

A portion of the cutting face 26 radially inward of the flat surface 42 may include one or more recesses extending into the diamond table 24 toward the substrate 22, one or more protrusions extending upward from the diamond table 24 away from the substrate 22, or a combination thereof. The flat surface 42 and the one or more recesses and/or protrusions may be configured to manipulate the direction of flow of formation cuttings flowing over the cutting face 26 of the diamond table 24, as more fully described in the aforementioned U.S. patent application Ser. No. 13/840,195, filed Mar. 15, 2013, now U.S. Pat. No. 9,428,966, issued on Aug. 30, 2016, to Patel et al. Additionally, the first and second chamfer surfaces 30, 36 may operatively cooperate with the flat surface 42 and the one or more recesses and/or protrusions to manipulate the direction of formation cuttings flowing over the cutting face 26 of the diamond table 24.

Multi-chamfer cutting elements 20 having recesses and/or protrusions in a cutting face 26 thereof, as described herein, may be fabricated using any number of techniques, including any of the techniques disclosed in the aforementioned U.S. Pat. No. 8,684,112, issued Apr. 1, 2014, to DiGiovanni et al.; U.S. Pat. No. 9,243,452, issued Jan. 26, 2016, to DiGiovanni et al.; and U.S. Pat. No. 9,482,057, issued Nov. 1, 2016, to DiGiovanni et al. For example, the cutting element 20 may be formed using a high temperature, high pressure (HTHP) process, as known in the art.

Chamfer surfaces, recessed surfaces and/or protrusions of the diamond table 24 may be formed in situ during the HTHP sintering process. Alternatively, chamfer surfaces and/or protrusions of the diamond table 24 may be formed after an HTHP sintering process. For example, a laser ablation process, as disclosed in U.S. Patent Publication No. 2009/0114628 A1, published May 7, 2009, in the name of DiGiovanni, the entire disclosure of which is incorporated herein by this reference, may be used to remove selected, localized regions of the diamond table 24, and may be used to form chamfer surfaces, recesses and/or protrusions, as described herein, of the diamond table 24. Additional, non-limiting examples of processes known in the art that may be utilized to assist in the formation of chamfer surfaces, recesses and/or protrusions of the diamond table 24 include an electro-discharge machining (EDM) process, a mechanical machining process, a leaching process, or any combination of the foregoing processes.

As more fully described in the aforementioned U.S. Pat. No. 9,482,057, issued Nov. 1, 2016, to DiGiovanni et al. and U.S. patent application Ser. No. 13/840,195, filed Mar. 15, 2013, now U.S. Pat. No. 9,428,966, issued Aug. 30, 2016, to Patel et al., the cumulative effect of the flat surface 42 of the cutting face 26 and a recess located radially inward of the flat surface 42 includes the inhibition or reduction of formation cuttings compacting together at the cutting face 26 and forming cohesive structures (i.e., chips). When a cutting element 20 having at least one recessed surface on the cutting face 26 at a sufficient depth-of-cut is pushed through an uncut formation, granular pieces of fractured formation may be inhibited or prevented from impacting the cutting element 20 after fracturing. As a result, the granular pieces of fractured formation may not compress together sufficiently to form cohesive structures of any substantial size and may in essence be "thrown forward" from the cutting face 26 and carried away by drilling fluid as granular pieces in discrete particulate form. The ability to produce such small, granular formation cuttings is believed to reduce friction between the formation and the cutting face 26 as well as to reduce not only the amount of heat transferred to the cutting element 20 but also the Mechanical Specific Energy (MSE) of the cutting elements 20 (i.e., the amount of work performed per unit volume of rock drilled) and the power required to operate an earth-boring tool utilizing such cutting elements 20.

Furthermore, a multi-chamfer cutting element 20 having a cutting face 26 with one or more recesses and/or protrusions associated therewith and configured as previously described allows the cutting element 20 to maintain the favorable performance characteristics discussed in the preceding paragraph while optimizing one or more of aggressiveness, durability, toughness, efficiency, and heat transfer properties of the cutting element 20.

With continued reference to FIG. 2, such recesses and/or protrusions of the diamond table 24 may include a first recessed surface 44 extending both radially inward and longitudinally downward into the diamond table 24 from the flat surface 42. A second recessed surface 46 of the diamond table 24 may be located radially inward of the first recessed surface 44 and may extend radially inward at an incline relative to a plane transverse to the longitudinal axis L of the cutting element 20 in a manner define a central protrusion 48 of the cutting face 26. The central protrusion 48 may be frusto-conical and may have a top surface 49 that is flat and co-planar with the flat surface 42, as shown; although, in other embodiments, the top surface 49 of the central protrusion 48 may be elevated or recessed in relation to the flat surface 42. It is to be appreciated that the center of the central protrusion 48 may be radially offset from the longitudinal axis L of the cutting element 20 in a manner to impart the diamond table 24 with an asymmetrical cutting face 26.

A radially innermost edge 50 of the first recessed surface 44 may be adjacent a peripheral edge 52 of the second recessed surface 46. The first and second recessed surfaces 44, 46 may together form a recess 54 in the cutting face 26 of the diamond table 24. The recess 54 may extend annularly over the cutting face 26 about the longitudinal axis L of the cutting element 20. In additional embodiments, the recess 54 may be defined by shapes other than an annulus. For example, as more fully described in the aforementioned U.S. Pat. No. 9,482,057, issued Nov. 1, 2016, to DiGiovanni et al., the recess 54 may be generally shaped as a square, as a regular n-sided polygon (where n may have any value from three (3) to infinity), or generally as a Reuleaux polygon (i.e., a curvilinear polygon built up of circular arcs) when viewed in a plane transverse to the longitudinal axis L of the cutting element 20.

Figure 3:
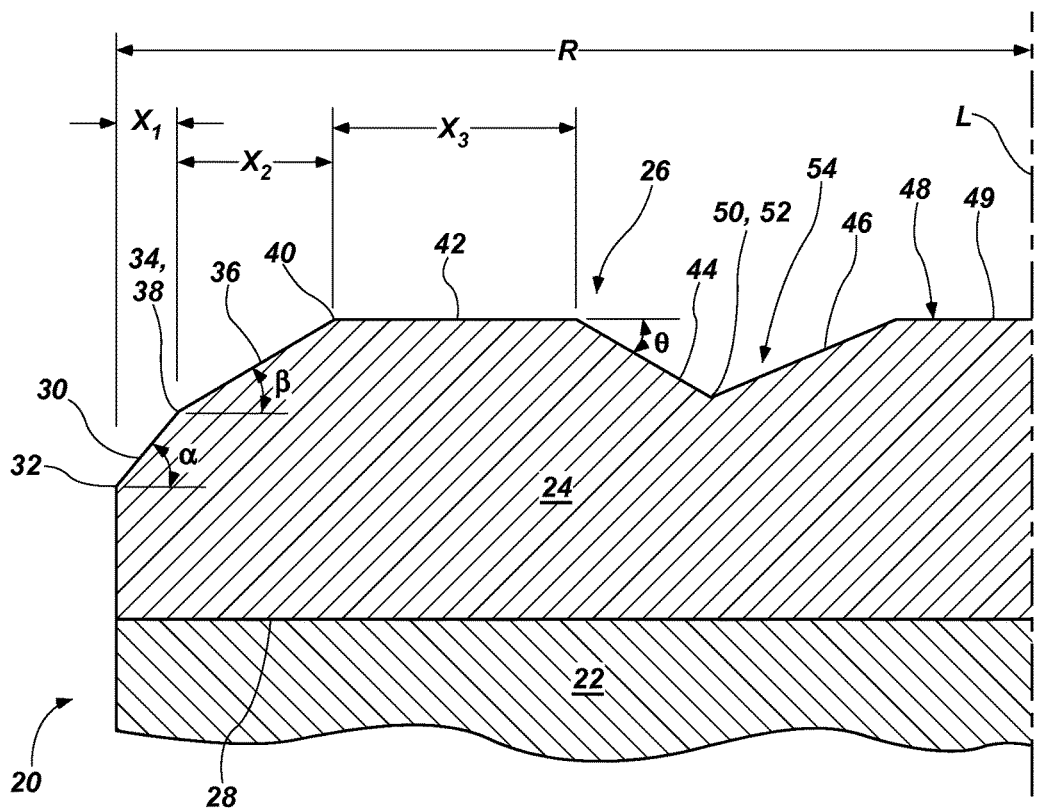
FIG. 3 illustrates a partial cross-sectional side view of the multi-chamfer cutting element of FIG. 2.

Referring now to FIG. 3, the first and second recessed surfaces 44, 46 may together impart the recess 54 with a chevron shape when viewed in a cross-sectional plane containing the longitudinal axis L of the cutting element 20, although other shapes are within the scope of the present embodiments. The first and second chamfer surfaces 30, 36, the flat surface 42, the first and second recessed surfaces 44, 46 and the protrusion 48 may each be sized, positioned and oriented to impart the cutting element 20 with tailored performance characteristics. For example, in embodiments where the cutting element 20 is a 16 mm (about 0.630 inch or about ⅝ inch) diameter cutting element, the first chamfer surface 30 may have a radial width $X_1$ between about 0.002 inch (about 0.051 mm) and about 0.045 inch (about 1.143 mm) measured between the peripheral edge 32 and the radially innermost edge 34 of the first chamfer surface 30 in a plane transverse to the longitudinal axis L of the cutting element 20. Additionally, the first chamfer surface 30 may be positioned at an incline α between about 10 degrees and about 80 degrees from a plane transverse to the longitudinal axis L of the cutting element 20.

The second chamfer surface 36 may have a radial width $X_2$ between about 0.002 inch (about 0.051 mm) and about 0.25 inch (about 6.35 mm) measured between the peripheral edge 38 and the radially innermost edge 40 of the second chamfer surface 36 in a plane transverse to the longitudinal axis L of the cutting element 20. The second chamfer surface 36 may be positioned at an incline β between about 10 degrees and about 80 degrees from a plane transverse to the longitudinal axis L of the cutting element 20.

The flat surface 42 may have a radial width $X_3$ between about 0.005 inch (about 0.127 mm) and about 0.125 inch (about 3.175 mm) measured between the radially innermost edge 40 of the second chamfer surface 36 and a peripheral edge of the first recessed surface 44 in a plane transverse to the longitudinal axis L of the cutting element 20. In other embodiments, the radial width $X_3$ of the flat surface 42 may be greater than 0.125 inch (3.175 mm).

The first recessed surface 44 may extend radially inward and into the diamond table 24 at a decline θ between about 10 degrees and about 90 degrees measured from the flat surface 42 of the cutting face 26.

The respective radial widths $X_1$, $X_2$, $X_3$ of the first chamfer surface 30, the second chamfer surface 36 and the flat surface 42 may each be expressed in terms as a ratio or percentage of a radius R of the cutting element 20. For example, in embodiments where the cutting element 20 is a 16 mm (about 0.630 inch or about ⅝ inch) diameter cutter, i.e., the cutting element 20 has a radius R of 8 mm (about 0.315 inch or about 5/16 inch), a radial width $X_1$ of the first chamfer surface 30 in the range between about 0.005 inch and about 0.045 inch may also be expressed as being in the range between about 0.01588R and about 0.14288R. Similarly, a radial width $X_2$ of the second chamfer surface 36 in the range between about 0.005 inch and about 0.035 inch may also be expressed as being in the range between about 0.01588R and about 0.01111R. Moreover, a radial width $X_3$ of the flat surface 42 in the range between about 0.005 inch and about 0.125 inch may also be expressed as being in the range between about 0.01588R and about 0.39688R.

It is to be appreciated that cutting elements 20 of sizes smaller or larger than a 16 mm diameter cutter, such as 19 mm diameter cutters and 8 mm diameter cutters, are within the scope of the embodiments disclosed herein. Furthermore, cutting elements 20 of any size may incorporate the width-to-radius ratios of the first chamfer surface 30, the second chamfer surface 36, and the flat surface 42, as previously described. For example, regardless of the diameter of the cutting element 20, the radial width $X_1$ of the first chamfer surface 30 may be between about 0.01588R and about 0.14288R; the radial width $X_2$ of the second chamfer surface 36 may be between about 0.01588R and about 0.01111R; and the radial width $X_3$ of the flat surface 42 may be between about 0.01588R and about 0.39688R. However, for simplicity, the distance dimensions of the cutting elements 20 described below are expressed in units of inches.

With continued reference to FIG. 3, according to one example embodiment, the first chamfer surface 30 may have a width $X_1$ of about 0.016 inch (about 0.406 mm) and may be positioned at an incline α of about 45 degrees from a plane transverse to the longitudinal axis L of the cutting element 20. The second chamfer surface 36 may have a width $X_2$ of about 0.020 inch (about 0.508 mm) and may be positioned at an incline β of about 20 degrees from a plane transverse to the longitudinal axis L of the cutting element 20. The flat surface 42 may have a width $X_3$ of about 0.031 inch (about 0.787 mm).

The inventors have performed extensive testing of various dual-chamfer cutting elements 20 using, for example, a CNC Vertical Boring Mill and have discovered that increasing the width $X_2$ of the second chamfer surface 36 has the effect of reducing the size of formation cuttings produced by the cutting element 20 during an earth-boring operation. Conversely, these tests have also shown that decreasing the width $X_2$ of the second chamfer surface 36 has the effect of increasing the size of formation cuttings produced by the cutting element 20. Decreasing the width $X_2$ of the second chamfer surface 36 also increases the aggressiveness of the cutting element 20 and reduces the amount of machining required to form the cutting element 20. The inventors' testing has also shown that reducing the width $X_2$ of the secondary chamfer surface 36 increases the efficiency of the cutting element 20 and increases the extent to which formation cuttings are "thrown forward" from the cutting face 26 of the cutting element 20 during an earth-boring operation. These tests have also shown that a secondary chamfer surface 36 having a width $X_2$ less than 0.055 inch (about 1.397 mm) may be able to absorb spalls during use that do not extend longitudinally forward and radially inward of (i.e., that do not "breach") the radially innermost edge 40 of the second chamfer surface 36.

The aggressiveness of the cutting element 20 may also be increased by decreasing the incline β angle of the second chamfer surface 36. By way of non-limiting example, for a more aggressive cutting element 20 relative to the previous embodiment, the second chamfer surface 36 may have a width $X_2$ of about 0.015 inch (about 0.381 mm) and may be positioned at an incline β of about 15 degrees from a plane transverse to the longitudinal axis L of the cutting element 20. The aggressiveness of the cutting element 20 may be further increased by providing the second chamfer surface 36 with a width $X_2$ between about 0.010 inch (about 0.254 mm) and about 0.005 inch (about 0.127 mm) and an incline β angle between about 15 degrees and about 10 degrees from a plane transverse to the longitudinal axis L of the cutting element 20.

Tests performed by the inventors have also shown that increasing the width $X_3$ of the flat surface 42 has the effect of reducing the MSE of the cutting element 20. Through testing and observation, it is believed by the inventors that increasing the width $X_3$ of the flat surface 42 also increases the toughness of the diamond table 24 at the peripheral edge 32. However, increasing the width $X_3$ of the flat surface 42 also increases the degree to which formation cuttings flow up the cutting face 26 of the cutting element 20 during an earth-boring operation.

Figure 4:
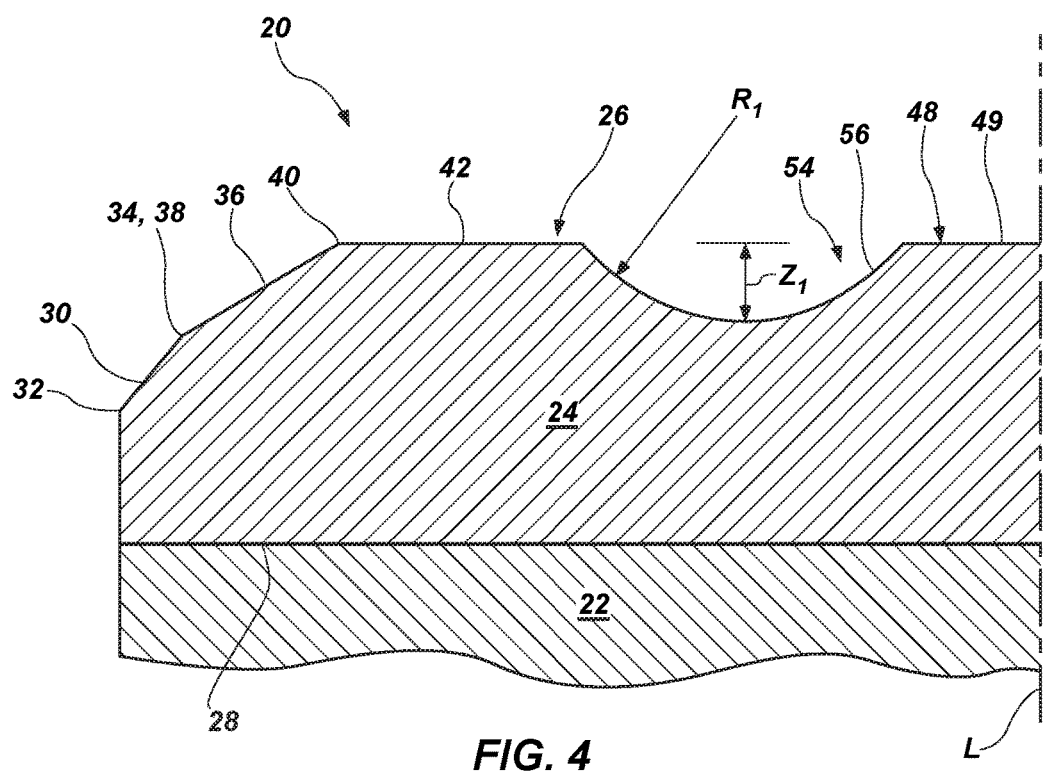
FIG. 4 illustrates a partial cross-sectional side view of a multi-chamfer cutting element having an arcuate recessed surface in a cutting face thereof, according to an embodiment of the present disclosure.

FIG. 4 illustrates an embodiment of the cutting element 20 having a recess 54 with an arcuate cross-sectional shape in a plane containing the longitudinal axis L of the cutting element 20. In such an embodiment, the flat surface 42 and the central protrusion 48 may be coplanar, and an arcuate recessed surface 56 of the diamond table 24 may be located radially inward of the flat surface 42 and may have a radius $R_1$ between about 0.010 inch (about 0.254 mm) and about 0.40 inch (about 10.16 mm) measured in a cross-sectional plane containing the longitudinal axis L of the cutting element 20. The arcuate recessed surface 56 may extend into the diamond table 24 at a depth $Z_1$ between about 0.005 inch (about 0.127 mm) and about 0.20 inch (about 0.508 mm). It is to be appreciated that, in other embodiments, the top surface 49 of the central protrusion 48 may be longitudinally elevated or recessed in relation to the flat surface 42. In such embodiments, the depth $Z_1$ of the arcuate recessed surface 56 may be between about 0.005 inch (about 0.127 mm) and about 0.20 inch (about 0.508 mm) measured from either the flat surface 42 or the top surface 49 of the central protrusion 48.

With continued reference to FIG. 4, a shape of the interface 28 between the diamond table 24 and the substrate 22 of the cutting element 20 may be configured to effectively distribute stresses caused by cutting forces and thus improve the structural integrity of the cutting element 20. It is to be appreciated that the arcuate recessed surface 56 and the shape of the interface 28 between the diamond table 24 and the substrate 22 may each be configured as described in any of the aforementioned U.S. Pat. No. 8,684,112, issued on Apr. 1, 2014, to DiGiovanni et al.; U.S. Pat. No. 9,482,057, issued Nov. 1, 2016, to DiGiovanni et al.; and U.S. Pat. No. 9,103,174, issued Aug. 11, 2015, to DiGiovanni.

Figure 5:
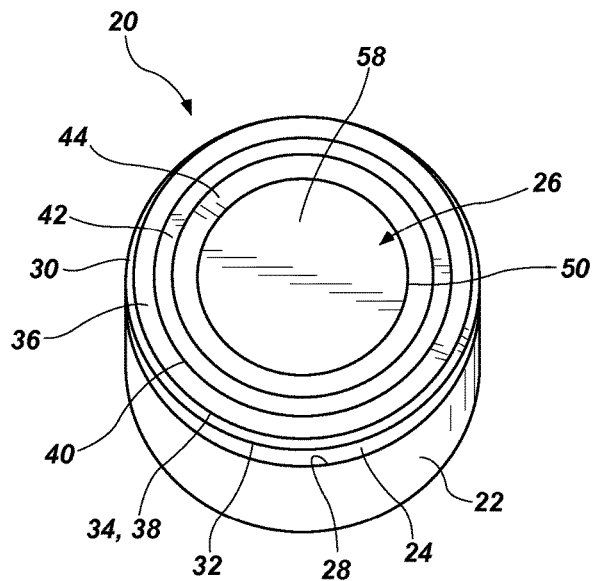
FIG. 5 illustrates a perspective view of a multi-chamfer cutting element having a planar recessed surface in a cutting face thereof, according to an embodiment of the present disclosure.
Figure 6:
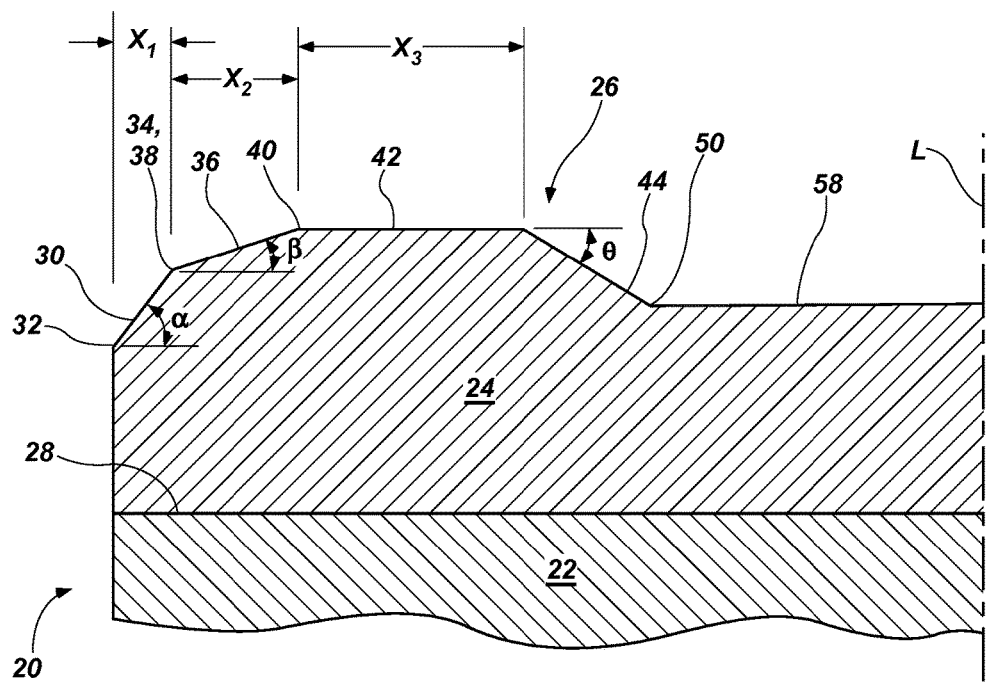
FIG. 6 illustrates a partial cross-sectional side view of the multi-chamfer cutting element of FIG. 5.

FIGS. 5 and 6 illustrate an embodiment of the multi-chamfer cutting element 20 similar to the embodiments of FIGS. 2 and 3, with a primary difference being that a second flat surface 58 extends radially inward from the radially innermost edge 50 of the first recessed surface 44 and parallel with a plane transverse to the longitudinal axis L of the cutting element 20. The respective widths $X_1$, $X_2$, $X_3$ of the first chamfer surface 30, the second chamfer surface 36 and the flat surface 42 may be as previously described with reference to FIGS. 2 and 3. A cutting element 20 configured as shown in FIGS. 5 and 6 has the advantage of reducing interaction of formation cuttings against the cutting face 26 because the formation cuttings impact less against the recessed second flat surface 58 than against the central protrusion 48 of the embodiments of FIGS. 2 and 3. As a result, the MSE of the cutting element 20 of FIGS. 5 and 6 is generally less than the MSE of the cutting element 20 of FIGS. 2 and 3. The inventors believe, based on their testing, that the reduced MSE of the cutting element 20 of FIGS. 5 and 6 may be advantageous for use in shale formations. Furthermore, the cutting element 20 of FIGS. 5 and 6 generally does not require additional weight-on-bit (WOB) relative to the cutting element of FIGS. 2 and 3 to achieve the substantially equivalent cutting efficiency.

Referring now to FIG. 6, in an additional embodiment, the first recessed surface 44 of the diamond table 24 may extend radially inward and into the diamond table 24 at a decline angle θ of about 10 degrees from the flat surface 42 of the cutting face 26. In a yet additional embodiment, the first recessed surface 44 of the diamond table 24 may extend radially inward and into the diamond table 24 at a decline angle θ of about 15 degrees from the flat surface 42 of the cutting face 26. As the decline angle θ angle of the first recessed surface 44 increases, the amount of formation cuttings interacting with the first recessed surface 44 decreases. In further embodiments, the first recessed surface 44 of the diamond table 24 may extend radially inward and into the diamond table 24 at a decline angle θ of about 90 degrees from the flat surface 42 of the cutting face 26 to minimize formation interaction with the first recessed surface 44. In yet other embodiments, the flat surface 42 may be located at a more peripheral location of the cutting face 26 relative to that of other embodiments by providing the first chamfer surface 30 with a width $X_1$ of about 0.016 inch (about 0.406 mm) and an incline angle α of about 45 degrees and the second chamfer surface 36 with a width $X_2$ of about 0.010 inch (about 0.254 mm) and an incline angle β of about 20 degrees. In such an embodiment, the decline angle θ of the first recessed surface may be about 12.5 degrees.

Figure 7:
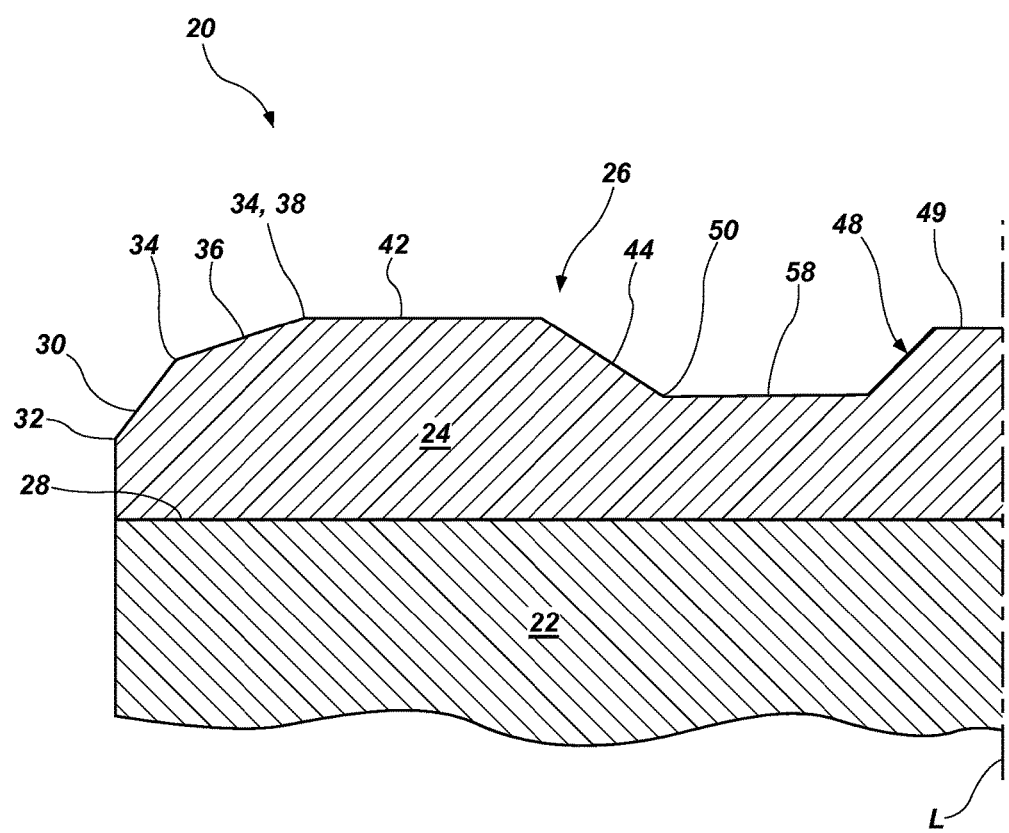
FIG. 7 illustrates a partial cross-sectional side view of a multi-chamfer cutting element having a centrally located protrusion extending upward from a planar recessed surface.

FIG. 7 illustrates an embodiment of the cutting element 20 similar to that shown in FIG. 6, wherein the cutting element 20 includes a central protrusion 48 located radially inward of and extending upwardly from the second flat surface 58. The central protrusion 48 may be frusto-conical in shape and may have a top surface 49 substantially coplanar with the flat surface 42. In other embodiments, the top surface 49 of the central protrusion 48 may be longitudinally elevated or recessed relative to the flat surface 42.

Figure 8:
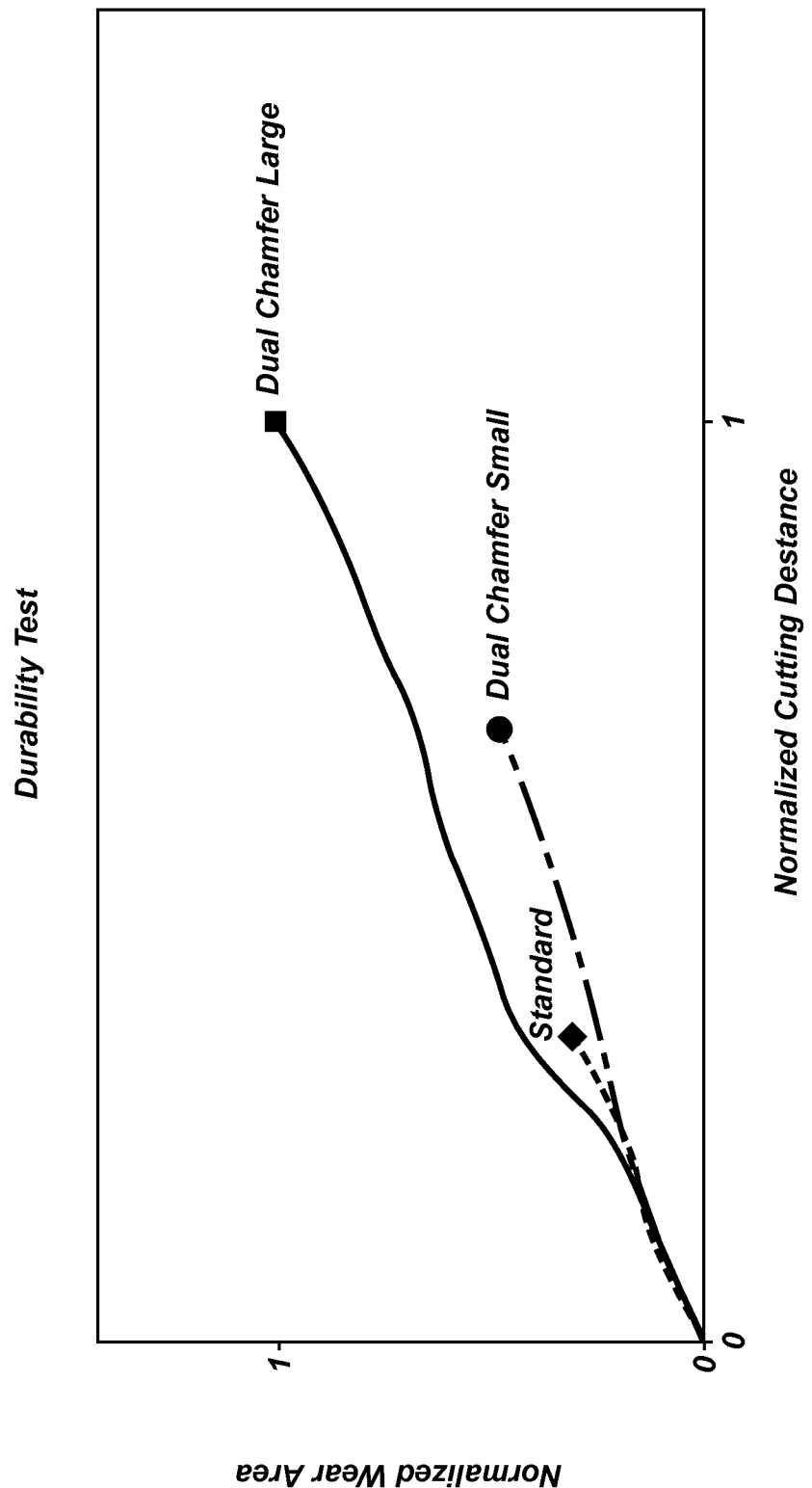
FIG. 8 is a graph of test results illustrating the durability of various cutting elements.

In FIG. 8, the normalized results of numerous tests conducted by the inventors are provided in a graph illustrating the comparative Durability Wear Progression of a single-chamfer cutting element (labeled "Standard") and two multi-chamfer cutting elements, one of which (labeled "Dual Chamfer Large") has a secondary chamfer width $X_2$ nearly twice as large as the other (labeled "Dual Chamfer Small"). The "Standard" single-chamfer cutting element had a chamfer with a radial width of about 0.016 inch (about 0.406 mm) measured in a plane transverse to a longitudinal axis L of the cutting element. The "Dual Chamfer Small" cutting element 20 had a first chamfer surface 30 with a width $X_1$ of about 0.010 inch (about 0.254 mm) and an incline angle α of about 45 degrees and a second chamfer surface 36 with a width $X_2$ of about 0.014 inch (about 0.356 mm) and an incline angle β of about 20 degrees. The "Dual Chamfer Large" cutting element 20 had a second chamfer surface 36 with a width $X_2$ of about 0.026 inch (about 0.660 mm) and was otherwise the same as the "Dual Chamfer Small" cutting element 20. The growth of a "Wear Scar Area," also known in the art as a "wear flat," was measured for each of the subject cutting elements, as shown on the Y-axis, versus a cutting distance of each of the subject cutting elements, as shown on the X-axis. The average point of failure of the diamond tables 24 of the subject cutting elements is illustrated by a unique indicator shape at the terminus of the plot line of each respective cutter. The performance of each of the subject cutting elements is shown as normalized in relation to the top performing cutting element. As shown, the "Dual Chamfer Small" cutting element 20 proved to absorb a larger wear scar area and cut a greater distance prior to failure than the "Standard" single-chamfer cutting element. Additionally, the "Dual Chamfer Large" cutting element 20 proved to be significantly tougher and more durable than both the "Standard" and the "Dual Chamfer Small" cutting elements, absorbing about twice as large a wear scar area and cutting nearly 50% more distance than the "Dual Chamfer Small" cutting element 20. The testing performed by the inventors indicates that providing a dual-chamfer to a cutting element may significantly add to the life of the cutting element. The test also indicates that increasing the width $X_2$ of the secondary chamfer surface 36 may further increase the durability and service life of the cutting element.

Figure 9:
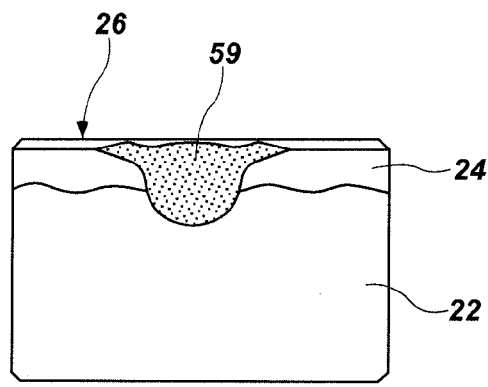
FIG. 9 illustrates a side elevation view of a worn single-chamfer cutting element charted in the graph of FIG. 8.
Figure 10:
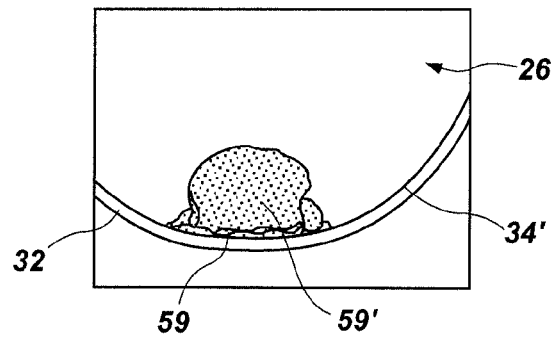
FIG. 10 illustrates a front elevation view of the worn cutting element of FIG. 9.
Figure 11:
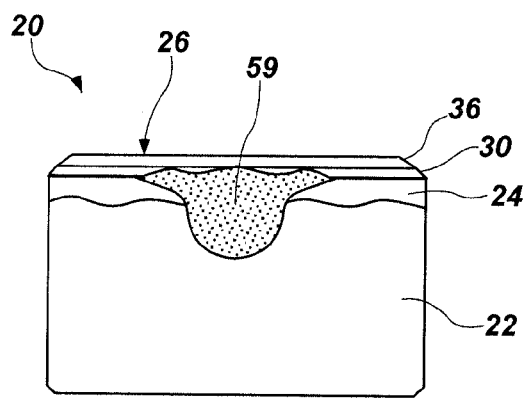
FIG. 11 illustrates a side elevation view of a worn dual-chamfer cutting element charted in the graph of FIG. 8.
Figure 12:
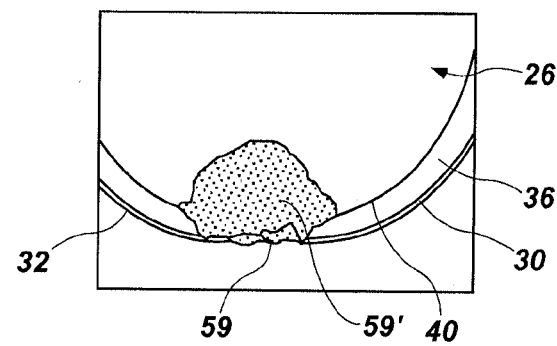
FIG. 12 illustrates a front elevation view of the worn cutting element of FIG. 11.
Figure 13:
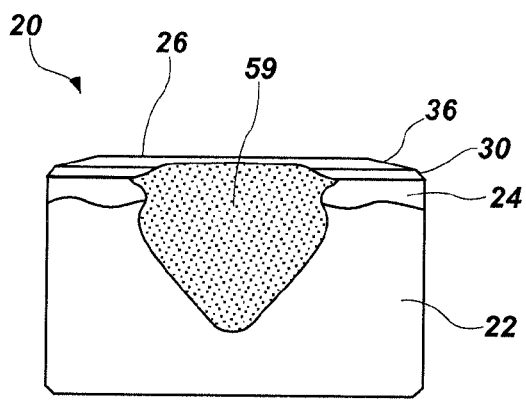
FIG. 13 illustrates a side elevation view of an additional worn dual-chamfer cutting element charted in the graph of FIG. 8.
Figure 14:
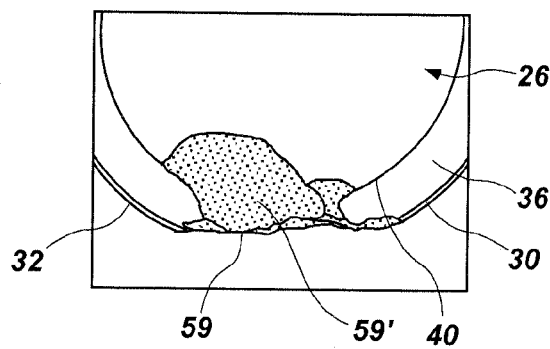
FIG. 14 illustrates a front elevation view of the worn cutting element of FIG. 13.

FIGS. 9 through 14 illustrate the wear observed by the inventors on the subject cutting elements charted in the graph of FIG. 8. FIGS. 9 and 10 depict respective side and front elevation views of wear absorbed by the "Standard" single-chamfer cutting element at the point at which its diamond table failed. FIGS. 11 and 12 depict respective side and front elevation views of wear absorbed by the "Small Dual Chamfer" cutting element 20 at the point at which its diamond table 24 failed. FIGS. 13 and 14 depict respective side and front plan views of wear absorbed by the "Large Dual Chamfer" cutting element 20 at the point at which its diamond table 24 failed. The size of a wear flat 59 formed in the respective diamond tables 24 and substrates 22 of the subject cutting elements is depicted in FIGS. 9, 11 and 13. The wear flats 59 can also be seen in FIGS. 10, 12 and 14, as can the sizes of a radial wear dimension, or "cutter height," originating at a cutting edge of the respective cutting elements and progressing through the diamond tables 24 and into the substrates. Spalls 59' formed in the diamond table 24 at the cutting edge 32 are also depicted in FIGS. 10, 12 and 14. It can be seen in FIGS. 12 and 14 that the cutter height formed in the diamond tables 24 of the dual-chamfered cutting elements 20 extend radially through the first chamfer surface 30 and into the second chamfer surface 36 but do not breach the radially innermost edge 40 of the second chamfer surface 36. Conversely, as shown in FIG. 10, the cutter height breached a radial innermost edge 34' of the single-chamfer cutting element. As shown in FIGS. 9 through 14, the cutter height and the wear flat 59 absorbed by the "Dual Chamfer Small" cutting element at the point of diamond table failure are each greater than those absorbed by the "Standard" single-chamfer cutting element. Furthermore, the cutter height and the wear flat absorbed by the "Dual Chamfer Large" cutting element at the point of diamond table failure are each greater than those absorbed by the "Dual Chamfer Small" cutting element and the "Standard" single-chamfer cutting element.

Figure 15:
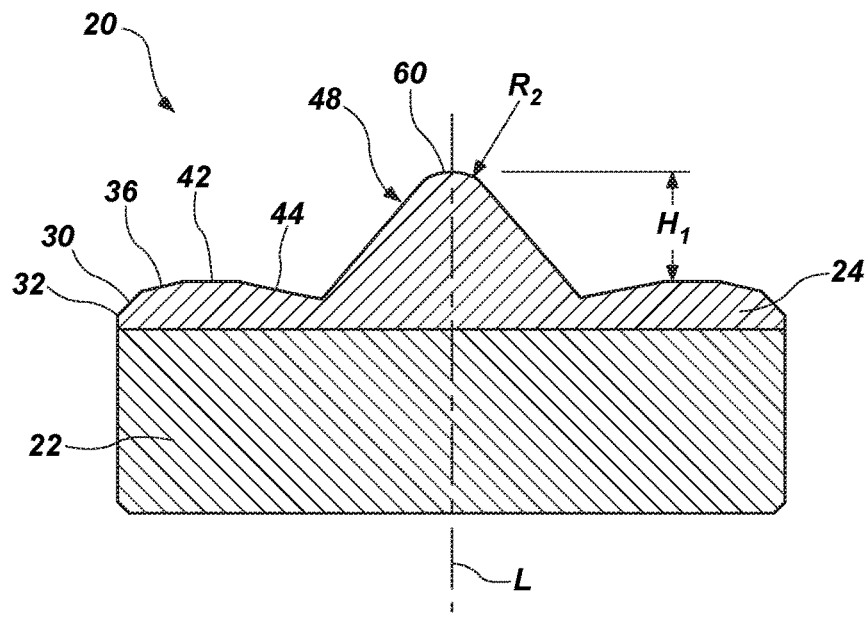
FIG. 15 illustrates a cross-sectional side view of a multi-chamfer cutting element having a conical protrusion extending upward from a recessed surface of a cutting face of the cutting element, according to an embodiment of the present disclosure.

FIG. 15 illustrates an additional embodiment of a multi-chamfer cutting element 20. The cutting element 20 of FIG. 15 may be configured similarly to the cutting element 20 depicted in FIGS. 2 and 3, with a difference being that the central protrusion 48 may be conical in shape. In this embodiment, the central protrusion 48 may have an apex 60 extending longitudinally above the flat surface 42 of the diamond table 24 a distance $H_1$ between about 0.010 inch (about 0.254 mm) and about 0.50 inch (about 12.7 mm). The apex 60 of the conical central protrusion 48 may be rounded at a radius $R_2$ between about 0.010 inch (about 0.254 mm) and about 0.25 inch (about 6.35 mm).

Figure 16:
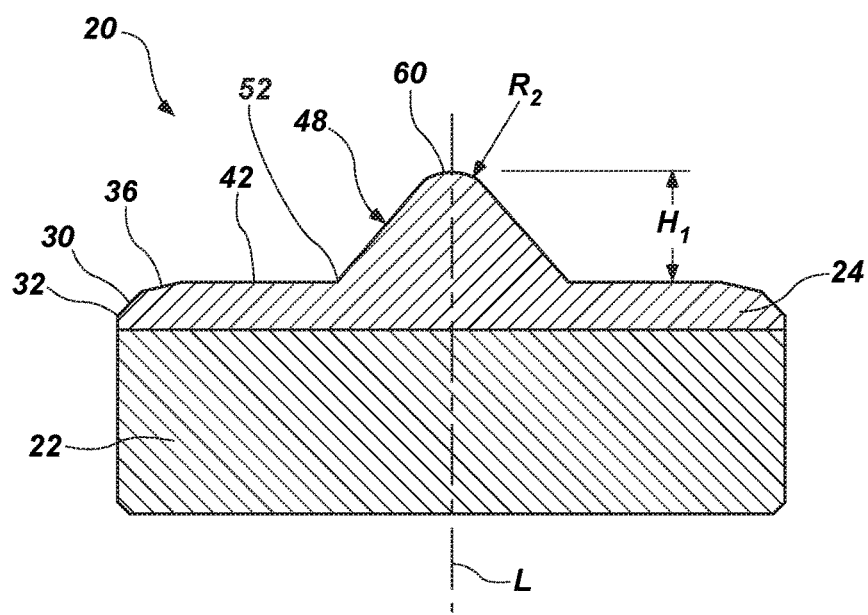
FIG. 16 illustrates a cross-sectional side view of a multi-chamfer cutting element having a conical protrusion extending upward from a flat surface of the cutting face of the cutting element, according to an embodiment of the present disclosure.

FIG. 16 illustrates a further embodiment of the multi-chamfer cutting element 20 similar to the embodiment of FIG. 15, wherein the flat surface 42 extends radially inward and is adjacent with a peripheral edge 52 of the central protrusion 48.

It is to be appreciated that the cutting face 26 of the multi-chamfer cutting elements 20 disclosed herein may include any number of shaped features, including any combination of the protrusions and/or recesses described in any of the aforementioned U.S. Pat. No. 8,684,112, issued on Apr. 1, 2014, to DiGiovanni et al.; U.S. Pat. No. 9,482,057, issued Nov. 1, 2016, to DiGiovanni et al.; U.S. Pat. No. 9,103,174, issued Aug. 11, 2015, to DiGiovanni; U.S. Pat. No. 9,243,452, issued Jan. 26, 2016, to DiGiovanni et al.; and U.S. patent application Ser. No. 13/840,195, filed Mar. 15, 2013, published as U.S. Pat. No. 9,428,966, issued Aug. 30, 2016, to Patel et al.

It is also to be appreciated that one or more of the surfaces of the cutting face 26 may be polished to have a surface finish roughness less than about 10 μin. (about 0.254 μm)

root mean square (RMS) and as low as about 0.3 µin. (0.00762 µm) or lower using any of the methods described in the aforementioned U.S. Pat. No. 8,991,525, issued Mar. 31, 2015, to Bilen et al. and also further described in U.S. patent application Ser. No. 13/840,195, filed Mar. 15, 2013, published as U.S. Pat. No. 9,428,966, issued Aug. 30, 2016, entitled "Cutting Elements for Earth-Boring Tools, Earth-Boring Tools Including Such Cutting Elements, and Related Methods," the entire disclosure of which is incorporated herein by this reference. For example, all or a portion of the first chamfer surface 30 and/or the second chamfer surface 36 may be polished to a surface finish roughness less than about 10 µin. (about 0.254 µm).

Figure 17:
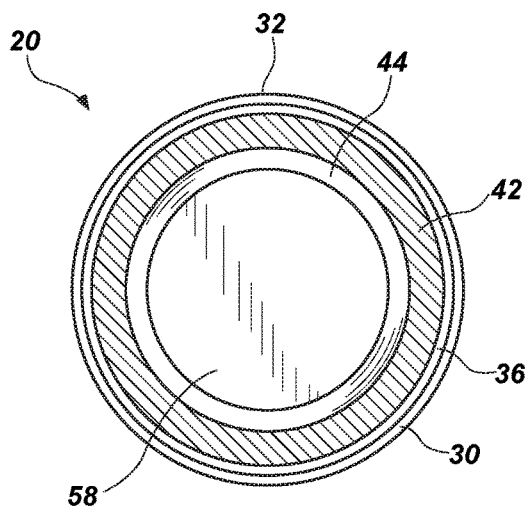
FIG. 17 illustrates a front elevation view of a cutting face of a multi-chamfer cutting element, wherein a portion of the cutting face is polished, according to an embodiment of the present disclosure.

As shown in FIG. 17, a cutting element 20 is depicted configured similarly to the cutting element 20 of FIGS. 5 and 6. The entire flat surface 42 of the diamond table 24 may be polished to a surface finish roughness less than about 10 µin. (about 0.254 µm) to prevent formation cuttings from compacting together at the flat surface 42 and forming cohesive structures as the cutting element 20 engages formation material. In other embodiments, a portion of the flat surface 42 less than the entire surface thereof may be polished to a surface finish roughness less than about 10 µin. (about 0.254 µm).

Figure 18:
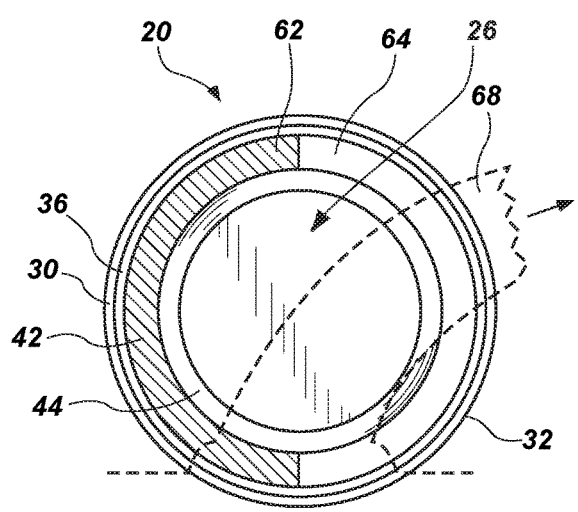
FIG. 18 illustrates a front elevation view of a cutting face of a multi-chamfer cutting element, wherein a portion of the cutting face is polished to influence flow of formation cuttings toward a lateral side of the cutting face as the cutting element engages a subterranean formation, according to an embodiment of the present disclosure.

Additionally, predetermined portions of any of the surfaces of the cutting face 26 of the cutting elements 20 disclosed herein may be polished to a surface finish roughness less than about 10 µin. (about 0.254 µm) for the purpose of directing formation cuttings to a particular side of the cutting face 26 as the cutting element 20 engages uncut formation material, as more fully described in the aforementioned U.S. Pat. No. 8,991,525, issued Mar. 31, 2015, to Bilen et al. For example, FIG. 18 illustrates a cutting element 20 configured similarly to the cutting element FIG. 17, with the primary difference being that the flat surface 42 of the cutting element 20 in FIG. 18 is polished to a surface finish roughness less than about 5 µin. (about 0.127 µm) on a first lateral portion 62 of the flat surface 42 while a second lateral portion 64 of the flat surface 42 remains unpolished and may have a surface finish roughness between about 20 µin. (about 0.508 µm) and about 40 µin. (about 1.016 µm). The relative difference between the surface finish roughness of the first lateral portion 62 and that of the second lateral portion 64 of the flat surface 42 may be sufficient to direct a stream of formation cuttings 68 moving over the cutting face 26 toward a lateral side of the cutting face 26 corresponding to the second lateral portion 64 of the flat surface 42.

Figure 19:
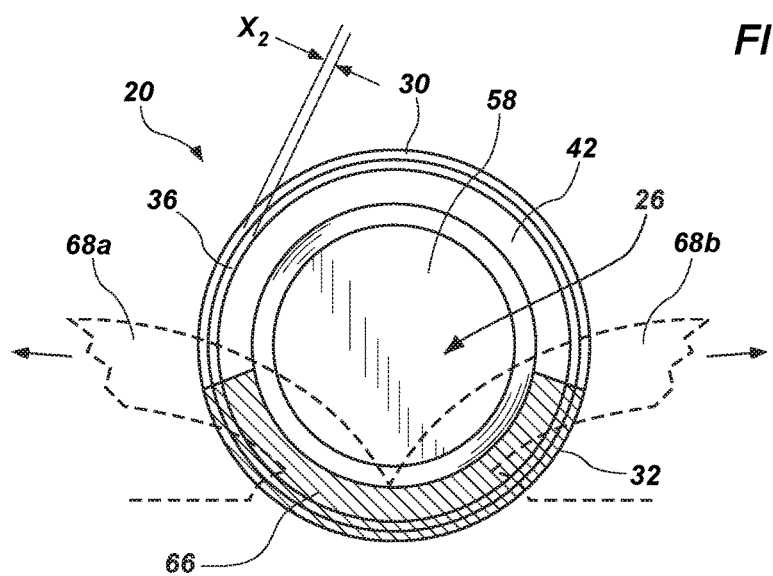
FIG. 19 illustrates a front elevation view of a cutting face of a multi-chamfer cutting element configured to generate two (2) distinct streams of formation cuttings flowing to opposing lateral sides of the cutting face, wherein a portion of the cutting face is polished to reduce the average size of formation cuttings in the two (2) discrete streams, according to an embodiment of the present disclosure.

In further embodiments, the size, shape and orientation of the surfaces of the cutting face 26 may produce two (2) discrete streams of formation cuttings flowing toward opposite sides of the cutting face 26 as the cutting element 20 engages formation material, as more fully described in the aforementioned U.S. patent application Ser. No. 13/840,195, filed Mar. 15, 2013, published as U.S. Pat. No. 9,428,966, issued as Aug. 30, 2016, to Patel et al. In such embodiments, predetermined portions of the surfaces of the cutting face 26 may be polished to a surface finish roughness less than about 10 µin. (about 0.254 µm) to allow the formation cuttings in the two (2) discrete streams to move more freely and thus prevent the formation cuttings from compacting together to form coherent structures, thereby reducing the size of formation cuttings in the two (2) discrete streams. For example, FIG. 19 illustrates a cutting element 20 configured similarly to the cutting element of FIGS. 5 and 6. The secondary chamfer surface 36 has a width $X_2$ of about 0.035 inch (about 0.889 mm). A region 66 of the first and second chamfer surfaces 30, 36 and the flat surface 42 proximate a location at which the peripheral edge 32 engages uncut formation material may be polished to a surface finish roughness less than about 10 µin. (about 0.254 µm). As the peripheral edge 32 of the first chamfer surface 30 engages formation material, the size, shape and orientation of the first and second chamfer surfaces 30, 36 may operatively divert formation cuttings into two (2) distinct streams 68a, 68b flowing toward opposite sides of the cutting face 26. The polished portion 66 of the first and second chamfer surfaces 30, 36 and the flat surface 42 allows the formation cuttings in the two (2) discrete streams 68a, 68b to move more freely over the cutting face 26 and thus inhibits formation of coherent structures within the two (2) discrete streams.

In some embodiments, a depth-of-cut limiting feature on an earth-boring tool may be positioned to inhibit interaction between an uncut earth formation and a recessed or protruding surface of the diamond table 24 during earth-boring operations. For example, such a depth-of-cut limiting feature on an earth-boring tool may be one or more of an outer surface of a blade 12 of the drill bit 10 shown in FIG. 1 and a bearing block feature as described in U.S. Patent Publication No. 2010/0276200 A1, published Nov. 4, 2010, in the name of Schwefe et al., the entire disclosure of which is incorporated herein by this reference, and as also described in the aforementioned U.S. Pat. No. 9,482,057, issued Nov. 1, 2016, to DiGiovanni et al. The depth-of-cut limiting feature may be positioned to be aligned with a radially outer edge of a recessed surface or a protruding surface of the diamond table, as described herein. In view of this, uncut formation may be prevented from contacting such a recess or protrusion during drilling operations.

Performance factors, such as aggressiveness, durability, efficiency, toughness, stability, steerability, power consumption, MSE, and passivity, may be tailored and balanced by strategically placing multi-chamfer cutting elements 20 configured as described herein on the tool at selected locations. Cutting elements 20 with a relatively smaller second chamfer surface 36, as described herein, may exhibit more aggressive cutting performance relative to conventional PDC cutting elements. Thus, performance of the cutting elements 20 may be further tailored for specific subterranean formations, such as, by way of non-limiting examples, horizontal shales or shaly sands. When harder or more interbedded formations are to be encountered, the tool design might retain a larger selection of more passive cutters, such as conventional PDC cutters or multi-chamfer cutting elements 20 with relatively larger second chamfer surfaces 36, as described herein, in the high depth-of-cut regions of the tool, while using more aggressive cutters, such as multi-chamfer cutting elements 20 with relatively smaller second chamfer surfaces 36, as described herein, in the lower depth-of-cut regions.

Figure 20:
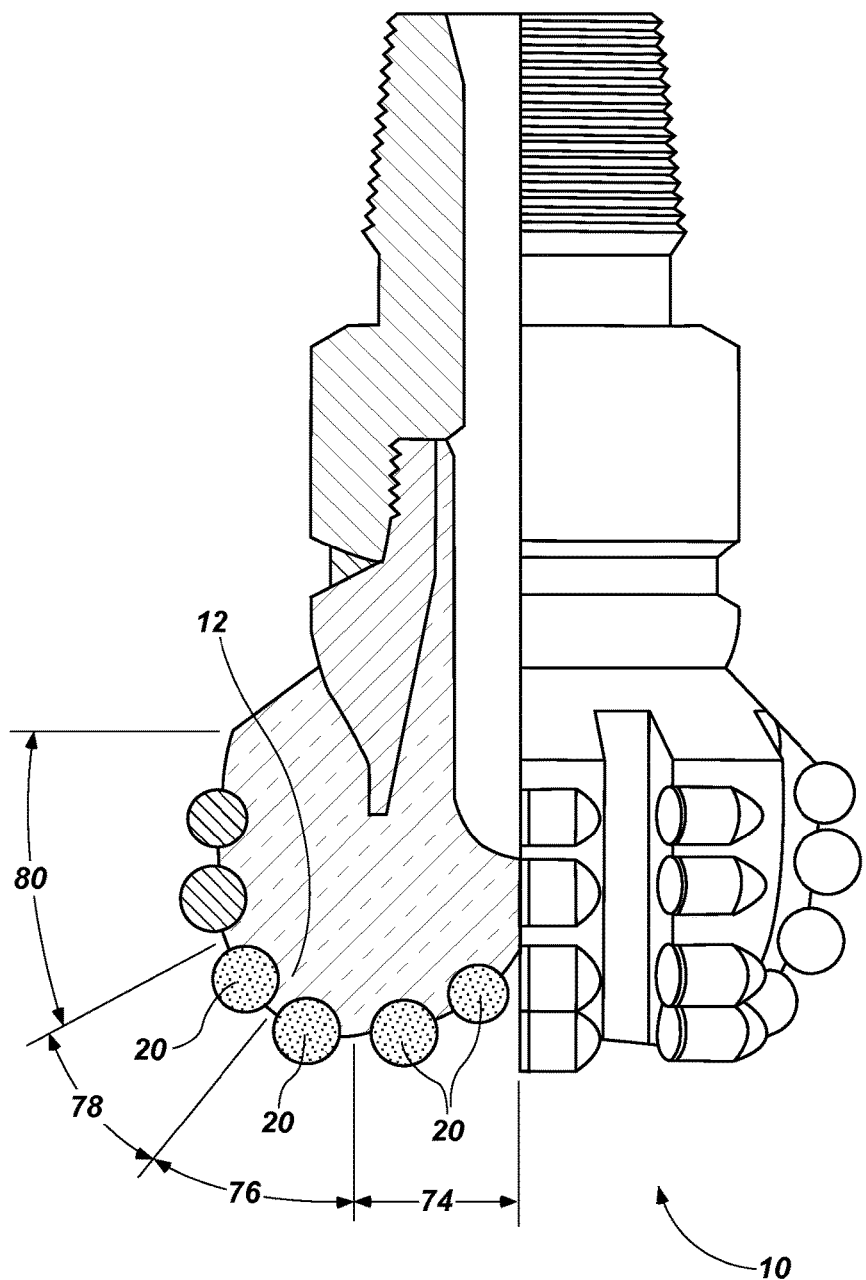
FIG. 20 illustrates a partial cross-sectioned side view of an embodiment of an earth-boring tool utilizing selective placement of multi-chamfer cutting elements, according to an embodiment of the present disclosure.

FIG. 20 is a simple cut-away, partial cross-sectional view illustrating an embodiment of an earth-boring tool utilizing selective placement of the cutting elements 20 of the present disclosure. For illustrative purposes, the earth-boring tool is the fixed-cutter rotary drill bit 10 of FIG. 1, configured as previously described, although it is to be recognized that the selective placement of embodiments disclosed herein may be incorporated on other earth-boring tools, such as reamers, hole-openers, casing bits, core bits, or other earth-boring tools.

The drill bit 10 includes a plurality of cutting elements mounted to each blade 12 of the drill bit 10. Moreover, as understood in the art, a profile of a drill bit 10, configured as shown in FIG. 20, may comprise a cone region 74, a nose region 76, a shoulder region 78, and a gage region 80. Cutting elements 20 located in the respective cone and nose regions 74, 76 of a blade 12 may be exposed to a greater depth-of-cut but subjected to a lesser work rate than cutting elements 20 located in other regions of the blade 12. Conversely, cutting elements 20 located in the shoulder region 78 of the blade 12 may be exposed to a higher work rate but a lesser depth-of-cut than cutting elements 20 in other regions of the blade 12. It is to be appreciated that multi-chamfer cutting elements 20 configured as described herein may be selectively located at specific regions of the blade 12 to optimize one or more desired performance characteristics. As shown in FIG. 20, multi-chamfer cutting elements 20 configured as described herein may be selectively located in the cone region 74 and the nose region 76, and may have first and second chamfer surfaces 30, 36 sized and positioned for specific high depth-of cut performance characteristics, such as, by way of non-limiting example, passivity and chip flow performance. Additionally, multi-chamfer cutting elements 20 configured as described herein may be selectively located in the shoulder region 78 of the blade 12, and may have first and second chamfer surfaces 30, 36 sized and positioned for specific high work rate performance characteristics, such as aggressiveness. The gage region 80 of the blade 12 may be fitted with conventional PDC cutting elements or other cutting elements tailored for specific performance characteristics. In additional embodiments (not shown), multi-chamfer cutting elements 20 configured as described herein may be selectively located in only one of the cone region 74, nose region 76, shoulder region 78, or gage region 80, while conventional PDC cutting elements or other cutting elements tailored for specific performance characteristics may be located in the remaining regions. In yet other embodiments, multi-chamfer cutting elements 20 configured as described herein may be selectively located in any combination of the cone region 74, nose region 76, shoulder region 78, or gage region 80, with conventional PDC cutting elements or other cutting elements tailored for specific performance characteristics located in the remaining regions of the blade 12.

Figure 21:
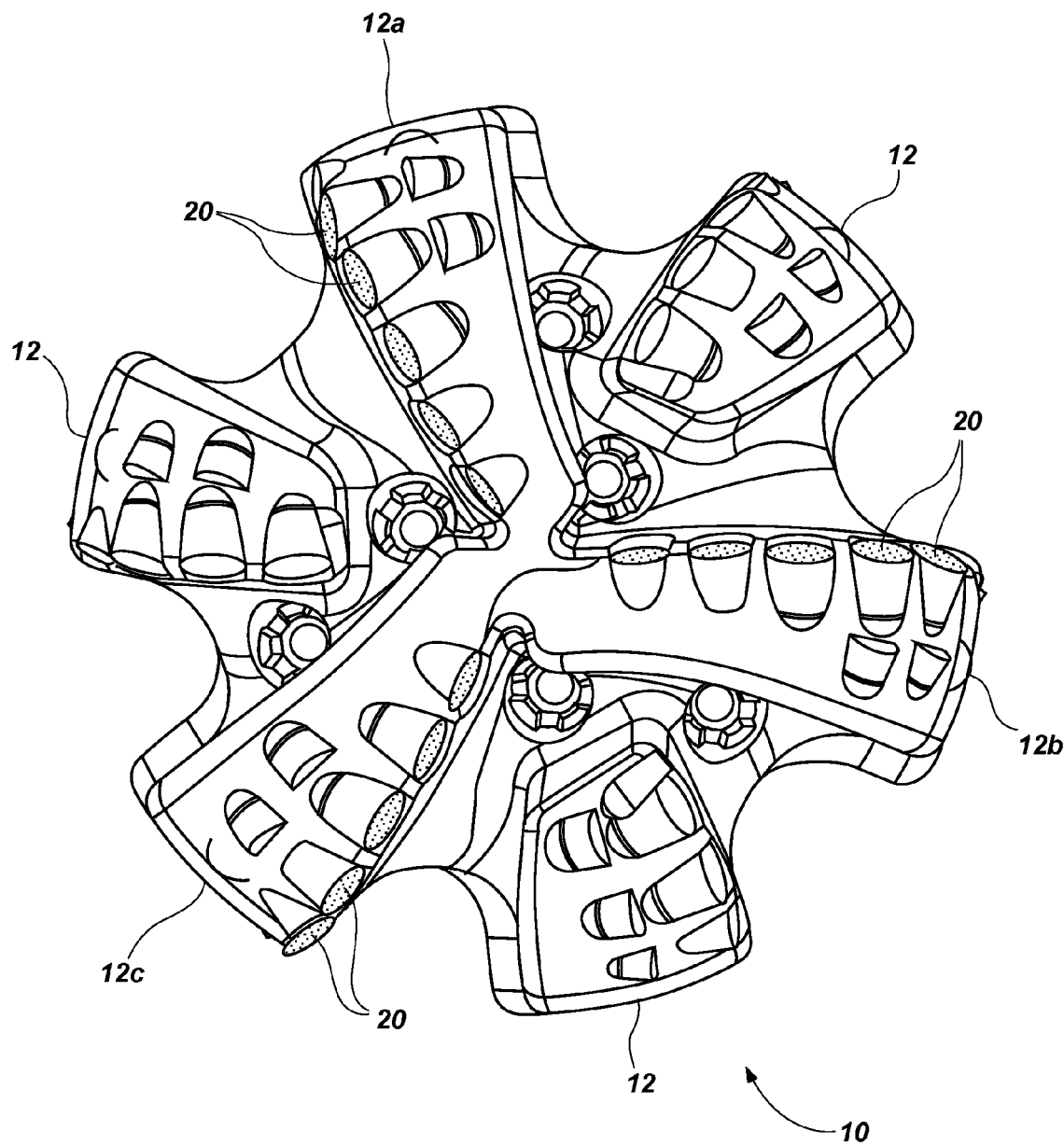
FIG. 21 illustrates a bottom view of an earth-boring tool depicting selective placement of multi-chamfer cutting elements, according to an embodiment of the present disclosure.

Additionally, referring to FIG. 21, multi-chamfer cutting elements 20 configured as described herein may be selectively located on one or more blades 12 of the drill bit 10. The drill bit 10 may be configured with multi-chamfer cutting elements 20 configured as described herein on alternating blades 12a-12c of the drill bit 10, while the remaining blades 12 may be fitted with conventional PDC cutting elements or other cutting elements tailored for specific performance characteristics. Benefits of such placement may include, among others, an optimal balance of the aggressiveness, stability and steerability of the drill bit 10. It is to be appreciated that in further embodiments, multi-chamfer cutting elements 20 configured as described herein may be selectively placed on specific blades and on specific regions of each specific blade, as described previously, to further tailor performance characteristics of the drill bit 10.

Embodiments of cutting elements of the present disclosure may be used to attain one or more of the advantages described above.

Although the foregoing description contains many specifics, these are not to be construed as limiting the scope of the present disclosure, but merely as providing certain example embodiments. Similarly, other embodiments of the disclosure may be devised which are within the scope of the present disclosure. For example, features described herein with reference to one embodiment may also be combined with features of other embodiments described herein. The scope of the disclosure is, therefore, indicated and limited only by the appended claims, rather than by the foregoing description. All additions, deletions, and modifications to the devices, apparatuses, systems and methods, as disclosed herein, which fall within the meaning and scope of the claims, are encompassed by the present disclosure.

What is claimed is:
1. A cutting element for an earth-boring tool, comprising:
a substrate;
a generally cylindrical side surface and a longitudinal axis parallel to the generally cylindrical side surface; and
a volume of superabrasive material positioned on the substrate, the volume of superabrasive material comprising:
a cutting face comprising a generally planar, flat surface transverse to the longitudinal axis of the cutting element, the cutting face having one or more of at least one recess extending into the volume of superabrasive material and at least one protrusion extending outward from the volume of superabrasive material;
a first chamfer surface having a peripheral edge and a radially innermost edge, the peripheral edge of the first chamfer surface defining a cutting edge of the volume of superabrasive material, wherein a radial width of the first chamfer surface, measured between the peripheral edge and the radially innermost edge of the first chamfer surface in a plane transverse to the longitudinal axis of the cutting element, is between about 0.002 inch and about 0.045 inch, the first chamfer surface inclined at an angle between about 10 degrees and about 65 degrees from a plane transverse to the longitudinal axis of the cutting element;
a second chamfer surface having a peripheral edge and a radially innermost edge, the peripheral edge of the second chamfer surface located adjacent the radially innermost edge of the first chamfer surface, wherein a radial width of the second chamfer surface, measured between the peripheral edge and the radially innermost edge of the second chamfer surface in a plane transverse to the longitudinal axis of the cutting element, is between about 0.014 inch and about 0.25 inch, the second chamfer surface inclined at an angle between about 10 degrees and about 40 degrees from a plane transverse to the longitudinal axis of the cutting element, the second chamfer surface inclined at an angle less than an angle at which the first chamfer surface is inclined from a plane transverse to the longitudinal axis of the cutting element; and
wherein the generally planar, flat surface of the cutting face has a peripheral edge and a radially innermost edge, the peripheral edge of the generally planar, flat surface located adjacent the radially innermost edge of the second chamfer surface, and wherein a radial width of the generally planar, flat surface, measured between the peripheral edge and the radially innermost edge of the generally planar, flat surface in a plane transverse to the longitudinal axis of the cutting element, is between about 0.005 inch and about 0.125 inch.
2. The cutting element of claim 1, wherein the first chamfer surface is inclined at an angle between about 35 degrees and about 65 degrees from a plane transverse to the longitudinal axis of the cutting element.

3. The cutting element of claim 1, wherein a radial width of the second chamfer surface, measured between the peripheral edge and the radially innermost edge of the second chamfer surface in a plane transverse to a longitudinal axis of the cutting element, is between about 0.014 inch and about 0.035 inch.

4. The cutting element of claim 1, wherein the second chamfer surface is inclined at an angle between about 25 degrees and about 40 degrees from a plane transverse to the longitudinal axis of the cutting element, wherein the second chamfer surface is inclined at an angle less than an angle at which the first chamfer surface is inclined from a plane transverse to the longitudinal axis of the cutting element.

5. The cutting element of claim 1, further comprising an inclined surface of the cutting face located radially inward of the planar, flat surface of the cutting face, at least a portion of the inclined surface of the cutting face being recessed into the volume of superabrasive material in relation to the planar, flat surface of the cutting face.

6. The cutting element of claim 5, further comprising a recessed surface of the cutting face extending radially between the planar, flat surface of the cutting face and the inclined surface of the cutting face, the recessed surface of the cutting face declining inward from the planar, flat surface of the cutting face at an angle between about 10 degrees and about 90 degrees.

7. The cutting element of claim 5, further comprising a central protrusion located radially inward of the inclined surface of the cutting face, the central protrusion extending upward from the recessed surface of the cutting face.

8. An earth-boring tool, comprising:
at least one cutting element affixed to a tool body of the earth-boring tool, the at least one cutting element comprising:
a volume of superabrasive material positioned on a substrate, the volume of superabrasive material comprising:
a cutting face having one or more of at least one recess extending into the volume of superabrasive material and at least one protrusion extending outward from the volume of superabrasive material;
a first chamfer surface having a peripheral edge and a radially innermost edge, the peripheral edge of the first chamfer surface defining a cutting edge of the volume of superabrasive material, wherein a radial width of the first chamfer surface is measured between the peripheral edge and the radially innermost edge of the first chamfer surface in a plane transverse to a longitudinal axis of the at least one cutting element;
a second chamfer surface having a peripheral edge and a radially innermost edge, the peripheral edge of the second chamfer surface located adjacent the radially innermost edge of the first chamfer surface, wherein a radial width of the second chamfer surface is measured between the peripheral edge and the radially innermost edge of the second chamfer surface in a plane transverse to a longitudinal axis of the at least one cutting element;
wherein the at least one cutting element located in one of a shoulder region and a gage region of a profile of a face of the earth-boring tool comprises the radial width of the first chamfer surface between about 0.005 inch and about 0.016 inch, the first chamfer surface inclined at an angle between about 25 degrees and about 40 degrees from a plane transverse to the longitudinal axis of the at least one cutting element, the radial width of the second chamfer surface between about 0.014 inch and about 0.026 inch, the second chamfer surface inclined at an angle between about 10 degrees and about 15 degrees from a plane transverse to the longitudinal axis of the at least one cutting element; and
wherein the at least one cutting element located in one of a cone region and a nose region of a profile of a face of the earth-boring tool comprises the radial width of the first chamfer surface between about 0.010 inch and about 0.016 inch, the first chamfer surface inclined at an angle between about 50 degrees and about 70 degrees from a plane transverse to the longitudinal axis of the at least one cutting element, the radial width of the second chamfer surface between about 0.026 inch and about 0.035 inch, the second chamfer surface inclined at an angle between about 25 degrees and about 40 degrees from a plane transverse to the longitudinal axis of the at least one cutting element.

9. The earth-boring tool of claim 8, further comprising a first planar, flat surface of the cutting face located radially inward of the second chamfer surface, the first planar, flat surface of the cutting face oriented substantially parallel with the plane transverse to the longitudinal axis of the at least one cutting element, the first planar, flat surface of the cutting face having a radial width between about 0.015 inch and about 0.063 inch measured in a plane transverse to the longitudinal axis of the at least one cutting element.

10. The earth-boring tool of claim 9, further comprising a second planar, flat surface of the cutting face located radially inward of the first planar, flat surface of the cutting face, the second planar, flat surface of the cutting face being recessed into the volume of superabrasive material in relation to the first planar, flat surface of the cutting face.

11. The earth-boring tool of claim 10, wherein the second planar, flat surface of the cutting face is a substantially planar surface oriented transverse to the longitudinal axis of the at least one cutting element.

12. The earth-boring tool of claim 9, further comprising a central protrusion located radially inward of the second planar, flat surface of the cutting face and extending upward from the first planar, flat surface of the cutting face, wherein the central protrusion is one of conical and frusto-conical.

13. The earth-boring tool of claim 12, wherein the central protrusion has a domed apex.

14. The earth-boring tool of claim 9, wherein at least a portion of the first planar, flat surface of the cutting face has a surface finish roughness less than about 5 µin. RMS.

15. The earth-boring tool of claim 9, wherein at least a portion of one or more of the first chamfer surface and the second chamfer surface has a surface finish roughness less than about 20 µin. RMS.

\* \* \* \* \*

UNITED STATES PATENT AND TRADEMARK OFFICE
CERTIFICATE OF CORRECTION

PATENT NO. : 9,650,837 B2  
APPLICATION NO. : 14/480293  
DATED : May 16, 2017  
INVENTOR(S) : Suresh G. Patel et al.

Page 1 of 1

It is certified that error appears in the above-identified patent and that said Letters Patent is hereby corrected as shown below:

In the Specification  
Column 1, Line 14, change "as May 15, 2012," to --May 15, 2012--  
Column 5, Line 18, change "separately fonded" to --separately formed--  
Column 13, Line 56, change "issued as Aug. 30, 2016," to --issued Aug. 30, 2016,--

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*